US012658958B2

(12) United States Patent
　　Aikawa et al.

(10) Patent No.:　US 12,658,958 B2
(45) Date of Patent:　Jun. 16, 2026

(54) RADIO-FREQUENCY MODULE AND COMMUNICATION DEVICE

(71) Applicant: Murata Manufacturing Co., Ltd., Nagaokakyo (JP)

(72) Inventors: Kiyoshi Aikawa, Nagaokakyo (JP); Takanori Uejima, Nagaokakyo (JP); Hiromichi Kitajima, Nagaokakyo (JP); Takashi Yamada, Nagaokakyo (JP); Yoshihiro Daimon, Nagaokakyo (JP); Syuichi Onodera, Nagaokakyo (JP); Yuudai Tanoue, Nagaokakyo (JP); Norihiro Shimada, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 292 days.

(21) Appl. No.: 18/475,222

(22) Filed: Sep. 27, 2023

(65) Prior Publication Data
　　US 2024/0022275 A1　　Jan. 18, 2024

Related U.S. Application Data

(63) Continuation　of　application　No. PCT/JP2022/010874, filed on Mar. 11, 2022.

(30) Foreign Application Priority Data

Mar. 31, 2021　(JP) ................................. 2021-060397
　Jul. 15, 2021　(JP) ................................. 2021-116892

(51) Int. Cl.
　　*H04B 1/38*　　(2015.01)
　　*H01Q 1/22*　　(2006.01)
　　　　(Continued)

(52) U.S. Cl.
　　CPC ............. *H04B 1/38* (2013.01); *H01Q 1/2283* (2013.01); *H03H 7/38* (2013.01); *H03H 9/25* (2013.01)

(58) Field of Classification Search
　　CPC .......... H04B 1/38; H04B 1/00; H04B 1/0458; H01Q 1/2283; H03H 7/38; H03H 9/25;
　　　　　　　　(Continued)

(56) References Cited

U.S. PATENT DOCUMENTS 11,424,195 B2 * 8/2022 Shaul .................. H01L 23/3128
2019/0157208 A1 * 5/2019 Lin ...................... H01Q 1/2283
　　　　　　　(Continued)

FOREIGN PATENT DOCUMENTS

JP　　　　2021-048565 A　　　3/2021
WO　　　2020/022180 A1　　　1/2020
　　　　　　　(Continued)

OTHER PUBLICATIONS

International Search Report and Written Opinion mailed on Jun. 14, 2022, received for PCT Application PCT/JP2022/010874, filed on Mar. 11, 2022, 9 pages including English Translation.

*Primary Examiner* — Un C Cho
(74) *Attorney, Agent, or Firm* — XSENSUS LLP

(57)　　　　　ABSTRACT

A radio-frequency module includes a module substrate having major surfaces opposite to each other; a module substrate having major surfaces opposite to each other, the major surface being disposed facing the major surface; a first electronic component disposed on the major surface; a second electronic component that includes a first electrode joined to the major surface and a second electrode joined to the major surface and that is disposed between the major surfaces; and a third electronic component disposed on the major surface; and an external connection terminal disposed on the major surface. The second electronic component is at
(Continued)

least one of a chip inductor, a chip capacitor, and a chip resistor. The second electronic component is coupled via the first electrode to the first electronic component and is coupled via the second electrode to the third electronic component or external connection terminal.

13 Claims, 12 Drawing Sheets

(51) Int. Cl.
    *H03H 7/38*           (2006.01)
    *H03H 9/25*           (2006.01)

(58) Field of Classification Search
    CPC .... H03H 9/0542; H03H 9/0552; H01L 23/00;
               H01L 25/00; H01L 25/065; H01L 25/07;
                                     H01L 25/18
    See application file for complete search history.

(56)               References Cited

U.S. PATENT DOCUMENTS

| | | | | |
|---|---|---|---|---|
| 2019/0378821 | A1* | 12/2019 | Costa | H10W 74/01 |
| 2020/0043896 | A1* | 2/2020 | Yu | H10D 84/038 |
| 2020/0253040 | A1* | 8/2020 | Dalmia | H05K 1/0239 |
| 2021/0050876 | A1* | 2/2021 | Matsumoto | H01L 23/5385 |
| 2022/0084962 | A1* | 3/2022 | Aleksov | H01P 3/12 |

FOREIGN PATENT DOCUMENTS

| | | | |
|---|---|---|---|
| WO | 2020/090230 | A1 | 5/2020 |
| WO | 2021/039076 | A1 | 3/2021 |

* cited by examiner

RADIO-FREQUENCY MODULE AND COMMUNICATION DEVICE

CROSS-REFERENCE TO RELATED APPLICATIONS

This is a continuation application of PCT/JP2022/010874, filed on Mar. 11, 2022, designating the United States of America, which is based on and claims priority to Japanese Patent Application No. JP 2021-116892 filed on Jul. 15, 2021, and Japanese Patent Application No. JP 2021-060397 filed on Mar. 31, 2021. The entire contents of the above-identified applications, including the specifications, drawings and claims, are incorporated herein by reference in their entirety.

TECHNICAL FIELD

The present disclosure relates to a radio-frequency module and a communication device.

BACKGROUND ART

In mobile communication devices, such as cellular phones, radio-frequency front-end modules are becoming more and more complicated with an increasing number of bands to be supported in particular. Patent Document 1 discloses a technique to reduce the size of a radio-frequency module by using two module substrates.

CITATION LIST

Patent Document

Patent Document 1: International Publication No. WO 2020/022180

SUMMARY OF DISCLOSURE

Technical Problem

According to the aforementioned technique in the related art, however, plural electronic components are distributed in the two module substrates, and the wiring lengths between the electronic components are increased.

The present disclosure provides a radio-frequency module and a communication device in which trace lengths between electronic components can be reduced.

Solution to Problem

A radio-frequency module according to an aspect of the present disclosure includes: a first module substrate including a first major surface and a second major surface that are opposite to each other; a second module substrate including a third major surface and a fourth major surface that are opposite to each other, the third major surface being disposed facing the second major surface; a plurality of electronic components disposed between the second major surface and the third major surface, on the first major surface, and on the fourth major surface; and an external connection terminal disposed on the fourth major surface. The plurality of electronic components include a first electronic component disposed on the first major surface, a second electronic component that includes a first electrode joined to the second major surface and a second electrode joined to a third major surface and that is disposed between the second major surface and the third major surface, and a third electronic component disposed on the fourth major surface. The second electronic component is at least one of a chip inductor, a chip capacitor, and a chip resistor. The second electronic component is coupled via the first electrode to the first electronic component and is coupled via the second electrode to the third electronic component or the external connection terminal.

Advantageous Effects of Disclosure

In the radio-frequency module according to an aspect of the present disclosure, the trace lengths between the electronic components can be reduced.

DESCRIPTION OF EMBODIMENTS

Figure 1:
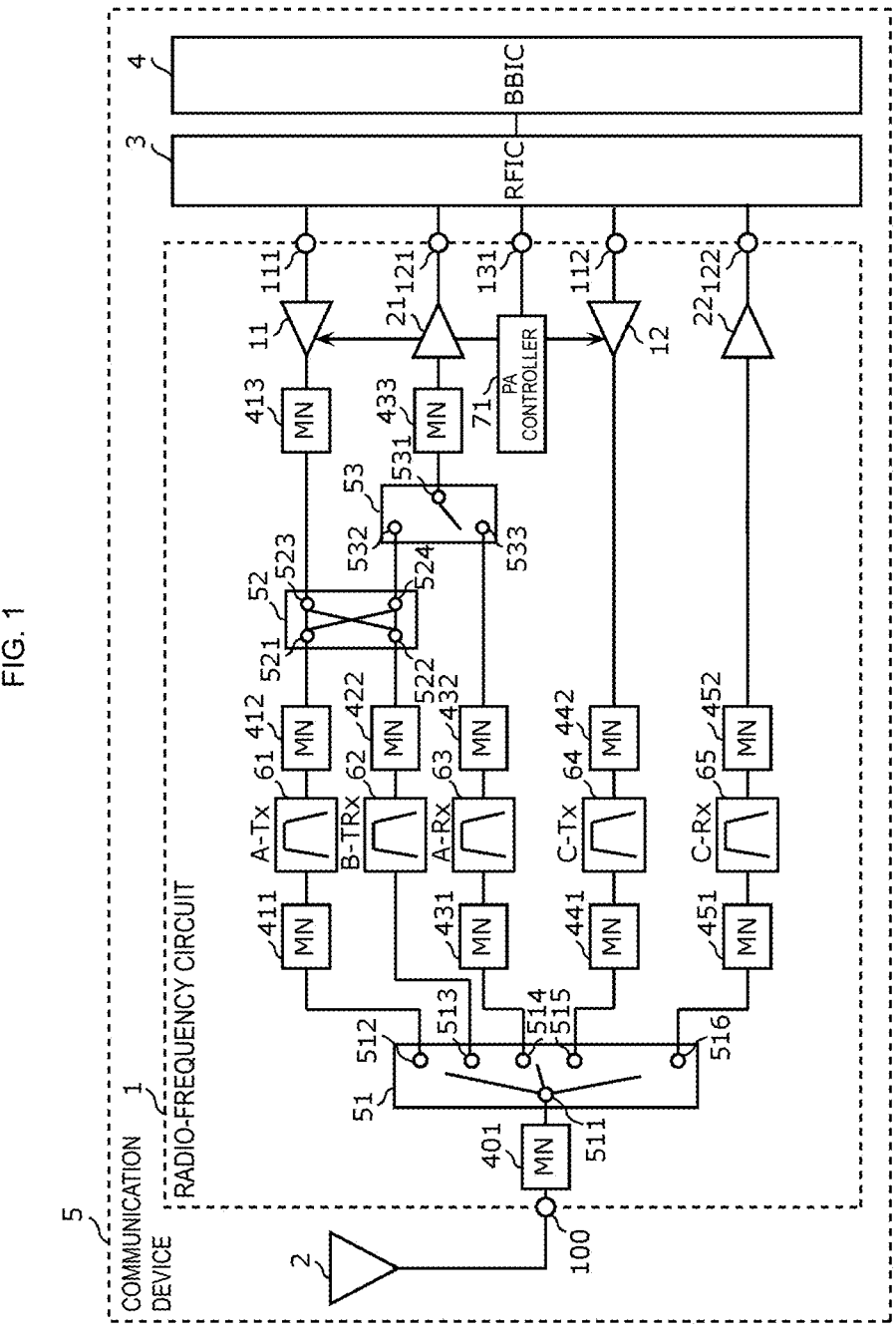
FIG. 1 is a circuit diagram of a radio-frequency circuit and a communication device according to an embodiment.

Hereinafter, an embodiment of the present disclosure is described in detail using the drawings. The embodiment described below illustrates a comprehensive or specific example. The numerical values, shapes, materials, constituent components, arrangements and connections of the constituent components, and the like described in the following embodiment are illustrative only and will not limit the present disclosure.

Each drawing is a schematic diagram including proper emphases, omissions, or adjustment of proportions in order to show the present disclosure and is not always illustrated exactly. The shapes, positional relationships, and proportions in each drawing are sometimes different from actual ones. In the drawings, substantially identical configurations are denoted by the same reference numerals, and redundant description may be omitted or simplified.

In each drawing below, x- and y-axes are orthogonal to each other on a plane parallel to the major surfaces of a module substrate. Specifically, assuming the module substrate is rectangular in a planar view, the x-axis is parallel to a first side of the module substrate, and the y-axis is parallel to a second side of the module substrate that is orthogonal to the first side. z-axis is vertical to the major surfaces of the module substrate, and the positive z-axis direction thereof is an upward direct while the negative z-axis direction is a downward direction.

In the circuit configuration of the present disclosure, "to be coupled" includes being directly coupled with a connection terminal and/or a trace conductor as well as being electrically coupled via another circuit element. "To be coupled between A and B" indicates to be coupled to both A and B between A and B and includes, in addition to be coupled in series to a path connecting A and B, to be coupled in parallel between the path and ground (shunt connection).

In a component arrangement of the present disclosure, a "planar view" refers to a view of an object orthogonally projected onto an x-y plane as seen in the negative z-axis direction. "A overlaps B in a planar view" means that the region of A orthogonally projected onto the x-y plane overlaps the region of B orthogonally projected onto the x-y plane. "A is disposed between B and C" means that at least one of plural line segments connecting any point within B and any point within C passes through A. "A is joined to B" means that A is physically coupled to B. Terms indicating relationships between elements, such as "parallel" or "vertical", terms indicating element shapes, such as "rectangular", and numerical ranges express not only their exact meaning but also substantially equivalent ranges, for example, including several percent errors.

In component arrangements of the present disclosure, "a component is disposed in a substrate" includes the component being disposed on a major surface of the substrate and the component being disposed within the substrate. "A component is disposed on a major surface of a substrate" includes being disposed in contact with a major surface of the substrate as well as being disposed on a major surface side without being in contact with the major surface (for example, the component is stacked atop another component disposed in contact with the major surface). In addition, "a component is disposed on a major surface of a substrate" may include the component being within a recess formed in the major surface. "A component is disposed within a substrate" includes being encapsulated within the module substrate as well as being partially exposed from the substrate although the component being fully disposed between the major surfaces of the substrate and the component being partially disposed within the substrate. "A component is disposed between two major surfaces" includes being disposed in contact with both the two major surfaces as well as being disposed in contact with one of the two major surfaces or disposed without being in contact with either of the two major surfaces.

Embodiment

1 Circuit Configuration of Radio-frequency Circuit 1 and Communication Device 5

The circuit configurations of a radio-frequency circuit 1 and a communication device 5 according to an embodiment are described with reference to FIG. 1. FIG. 1 is a circuit diagram of the radio-frequency circuit 1 and communication device 5 according to the embodiment.

1.1 Circuit Configuration of Communication Device 5

First, the circuit configuration of the communication device 5 is described. As illustrated in FIG. 1, the communication device 5 according to the embodiment includes the radio-frequency circuit 1, an antenna 2, a radio frequency integrated circuit (RFIC) 3, and a baseband integrated circuit (BBIC) 4.

The radio-frequency circuit 1 transfers radio-frequency signals between the antenna 2 and the RFIC 3. The internal configuration of the radio-frequency circuit 1 is described later.

The antenna 2 is coupled to an antenna connection terminal 100 of the radio-frequency circuit 1. The antenna 2 transmits a radio-frequency signal outputted from the radio-frequency circuit 1. The antenna 2 receives a radio-frequency signal from the outside and outputs the received radio-frequency signal to the radio-frequency circuit 1.

The RFIC 3 is an example of a signal processing circuit to process radio-frequency signals. Specifically, the RFIC 3 performs signal processing, such as down-conversion, for a radio-frequency reception signal inputted through a reception path of the radio-frequency circuit 1 and outputs to the BBIC 4, the reception signal generated through the signal processing. The RFIC 3 performs signal processing, such as up-conversion, for a transmission signal inputted from the BBIC 4 and outputs a radio-frequency transmission signal generated by the signal processing to a transmission path of the radio-frequency circuit 1. The RFIC 3 includes a controller to control switches, amplifiers, and other elements included in the radio-frequency circuit 1. Part of or all of the functions of the RFIC 3 as a controller may be implemented outside the RFIC 3 and, for example, may be implemented in the BBIC 4 or the radio-frequency circuit 1.

The BBIC 4 is a baseband signal processing circuit that performs signal processing using an intermediate frequency band lower than frequencies of radio-frequency signals transferred by the radio-frequency circuit 1. Examples of the signals to be processed by the BBIC 4 are image signals for image display and/or audio signals for voice calls using a speaker.

In the communication device 5 according to the embodiment, the antenna 2 and BBIC 4 are not essential constituent elements.

1.2 Circuit Configuration of Radio-frequency Circuit 1

Next, the circuit configuration of the radio-frequency circuit 1 is described. As illustrated in FIG. 1, the radio-frequency circuit 1 includes power amplifiers (PAs) 11 and 12, low-noise amplifiers (LNAs) 21 and 22, matching networks (MN) 401, 411 to 413, 422, 431 to 433, 441, 442, 451, and 452, switches (SWs) 51 to 53, filters 61 to 65, a PA controller (PAC) 71, the antenna connection terminal 100, radio-frequency input terminals 111 and 112, radio-frequency output terminals 121 and 122, and control terminal 131. Hereinafter, the constituent elements of the radio-frequency circuit 1 are described sequentially.

The antenna connection terminal 100 is coupled to the antenna 2 outside the radio-frequency circuit 1.

Each of the radio-frequency input terminals 111 and 112 is a terminal to receive radio-frequency transmission signals from the outside of the radio-frequency circuit 1. In the embodiment, the radio-frequency input terminals 111 and 112 are coupled to the RFIC 3 outside the radio-frequency circuit 1.

Each of the radio-frequency output terminals 121 and 122 is a terminal to supply radio-frequency reception signals to the outside of the radio-frequency circuit 1. In the embodiment, the radio-frequency output terminals 121 and 122 are coupled to the RFIC 3 outside the radio-frequency circuit 1.

The control terminal 131 is terminal to transfer control signals. Specifically, the control terminal 131 is terminal to receive control signals from the outside of the radio-frequency circuit 1 and/or terminals to supply control signals to the outside of the radio-frequency circuit 1. The control signals are signals concerning control of electronic circuits included in the radio-frequency circuit 1. Specifically, the control signals are digital signals to control at least one of the power amplifiers 11 and 12, low-noise amplifiers 21 and 22, and switches 51 to 53, for example.

The power amplifier 11 is coupled between the radio-frequency input terminal 111 and the filters 61 and 62 and is able to amplify transmission signals in bands A and B. Specifically, the input end of the power amplifier 11 is coupled to the radio-frequency input terminal 111. The output end of the power amplifier 11 is coupled to the filter 61 via the matching network 413, switch 52, and matching network 412. The output end of the power amplifier 11 is also coupled to the filter 62 via the matching network 413, switch 52, and matching network 422.

The power amplifier 12 is coupled between the radio-frequency input terminal 112 and the filter 64 and is able to amplify transmission signals in band C. Specifically, the input end of the power amplifier 12 is coupled to the radio-frequency input terminal 112. The output end of the power amplifier 12 is coupled to the filter 64 via the matching network 442.

Note that the power amplifiers 11 and 12 are electronic components that provide an output signal having a larger energy than an input signal (a transmission signal) based on power supplied from a power supply. Each of the power amplifiers 11 and 12 includes an amplification transistor and may further include an inductor and/or a capacitor. The internal configuration of the power amplifiers 11 and 12 are not limited. For example, each of the power amplifiers 11 and 12 may be a multistage amplifier, a differential amplifier, or a Doherty amplifier.

The low-noise amplifier 21 is coupled between the filter 62 and 63 and the radio-frequency output terminal 121 and is able to amplify reception signals in the bands A and B. Specifically, the input end of the low-noise amplifier 21 is coupled to the filter 62 via the matching network 433, switches 53 and 52, and matching network 422. The input end of the low-noise amplifier 21 is also coupled to the filter 63 via the matching network 433, switch 53, and matching network 432. The output end of the low-noise amplifier 21 is coupled to the radio-frequency output terminal 121.

The low-noise amplifier 22 is coupled between the filter 65 and the radio-frequency output terminal 122 and is able to amplify reception signals in the band C.
Specifically, the input end of the low-noise amplifier 22 is coupled to the filter 65 via the matching network 452. The output end of the low-noise amplifier 22 is coupled to the radio-frequency output terminal 122.

The low-noise amplifiers 21 and 22 are electronic components that provide an output signal having a larger energy than that of an input signal (a reception signal) based on power supplied from the power supply. Each of the low-noise amplifiers 21 and 22 includes an amplification transistor and may further include an inductor and/or a capacitor. The internal configurations of the low-noise amplifiers 21 and 22 are not limited.

Each of the matching networks 401, 411 to 413, 422, 431 to 433, 441, 442, 451, and 452 is coupled between two circuit elements and is able to provide impedance matching between the two circuit elements. Thus, each of the matching networks 401, 411 to 413, 422, 431 to 433, 441, 442, 451, and 452 is an impedance matching network. Each of the matching networks 401, 411 to 413, 422, 431 to 433, 441, 442, 451, and 452 includes an inductor and may further include a capacitor.

The switch 51 is coupled between the antenna connection terminal 100 and the filters 61 to 65. The switch 51 includes terminals 511 to 516. The terminal 511 is coupled to the antenna connection terminal 100. The terminal 512 is coupled to the filter 61 via the matching network 411. The terminal 513 is coupled to the filter 62. The terminal 514 is coupled to the filter 63 via the matching network 431. The terminal 515 is coupled to the filter 64 via the matching network 441. The terminal 516 is coupled to the filter 65 via the matching network 451.

In this connection configuration, the switch 51 is able to connect the terminal 511 to at least one of the terminals 512 to 516 based on a control signal from the RFIC 3, for example. The switch 51 is able to switch whether to couple the antenna connection terminal 100 to each of the filters 61 to 65. The switch 51 is composed of a multi-connection switch circuit, for example, and is sometimes referred to as an antenna switch.

The switch 52 is coupled between the output end of the power amplifier 11 and the filters 61 and 62 and is coupled between the input end of the low-noise amplifier 21 and the filter 62. The switch 52 includes terminals 521 to 524. The terminal 521 is coupled to the filter 61 via the matching network 412. The terminal 522 is coupled to the filter 62 via the matching network 422. The terminal 523 is coupled to the output end of the power amplifier 11 via the matching network 413. The terminal 524 is coupled to the input end of the low-noise amplifier 21 via the switch 53 and matching network 433.

In this connection configuration, the switch 52 is able to couple the terminal 523 to at least one of the terminals 521 and 522 and couple the terminal 522 to at least one of the terminals 523 and 524 based on a control signal from the RFIC 3, for example. The switch 52 is able to switch whether to couple the power amplifier 11 to each of the filters 61 and 62 and is able to switch connections between the filter 62 and the power amplifier 11 and between the filter 62 and the low-noise amplifier 21. The switch 52 is composed of a multi-connection switch circuit, for example.

The switch 53 is coupled between the input end of the low-noise amplifier 21 and the filters 62 and 63. The switch 53 includes terminals 531 to 533. The terminal 531 is coupled to the input end of the low-noise amplifier 21 via the matching network 433. The terminal 532 is coupled to the terminal 524 of the switch 52 and is coupled to the filter 62 via the switch 52 and matching network 422. The terminal 533 is coupled to the filter 63 via the matching network 432.

In this connection configuration, the switch 53 is able to couple the terminal 531 to at least one of the terminals 532 and 533 based on a control signal from the RFIC 3, for example. The switch 53 is thus able to switch whether to couple the low-noise amplifier 21 to each of the filters 62 and 63. The switch 53 is composed of a multi-connection switch circuit, for example.

The filter 61 (A-Tx) is coupled between the power amplifier 11 and the antenna connection terminal 100. Specifically, an end of the filter 61 is coupled to the antenna connection terminal 100 via the matching network 411, switch 51, and matching network 401. The other end of the filter 61 is coupled to the output end of the power amplifier 11 via the matching network 412, switch 52, and matching network 413. The filter 61 has a pass band including an uplink operation band of the band A for frequency division duplex (FDD) and is able to pass transmission signals in the band A.

The filter 62 (B-TRx) is coupled between the antenna connection terminal 100 and the power amplifier 11 and is coupled between the antenna connection terminal 100 and the low-noise amplifier 21. Specifically, an end of the filter 62 is coupled to the antenna connection terminal 100 via the switch 51 and matching network 401. The other end of the filter 62 is coupled to the output end of the power amplifier 11 via the matching network 422, switch 52, and matching network 413 and is coupled to the input end of the low-noise amplifier 21 via the matching network 422, switches 52 and 53, and matching network 433. The filter 62 has a pass band including the band B for time division duplex (TDD) and is able to pass transmission and reception signals in the band B.

The filter 63 (A-Rx) is coupled between the low-noise amplifier 21 and the antenna connection terminal 100. Specifically, an end of the filter 63 is coupled to the antenna connection terminal 100 via the matching network 431, switch 51, and matching network 401. The other end of the filter 63 is coupled to the input end of the low-noise amplifier 21 via the matching network 432, switch 53, and matching network 433. The filter 63 has a pass band including a downlink operation band of the band A for FDD and is able to pass reception signals in the band A.

The filter 64 (C-Tx) is coupled between the power amplifier 12 and the antenna connection terminal 100. Specifically, an end of the filter 64 is coupled to the antenna connection terminal 100 via the matching network 441, switch 51, and matching network 401. The other end of the filter 64 is coupled to the output end of the power amplifier 12 via the matching network 442. The filter 64 has a pass band including an uplink operation band of the band C for FDD and is able to pass transmission signals in the band C.

The filter 65 (C-Rx) is coupled between the low-noise amplifier 22 and the antenna connection terminal 100. Specifically, an end of the filter 65 is coupled to the antenna connection terminal 100 via the matching network 451, switch 51, and matching network 401. The other end of the filter 65 is coupled to the input end of the low-noise amplifier 22 via the matching network 452. The filter 65 has a pass band including a downlink operation band of the band C for FDD and is able to pass reception signals in the band C.

The PA controller 71 is able to control the power amplifiers 11 and 12. The PA controller 71 receives digital control signals from the RFIC 3 via the control terminal 131 and outputs control signals to the power amplifiers 11 and 12.

The bands A to C are frequency bands for communication systems built by using a radio access technology (RAT). The bands A to C are previously defined by a standards body or the like (the 3rd Generation Partnership Project (3GPP) or the Institute of Electrical and Electronics Engineers (IEEE), for example). Examples of the communication systems are a 5th generation new radio (5GNR) system, a long term evolution (LTE) system, and a wireless local area network (WLAN) system.

The bands A and B may be included in a different band group from the band C or may be included in the same band group. Herein, a band group indicates a range of frequencies including plural bands. Band groups can be an ultra-high band group (3300 to 5000 MHz), a high-band group (2300 to 2690 MHz), a mid-band group (1427 to 2200 MHz), and a low-band group (698 to 960 MHz), for example, but are not limited thereto. For example, the band groups may include a band group including an unlicensed band not lower than 5 GHz or a band group in the millimeter wave band.

For example, the bands A and B may be included in the high-band group while the band C is included in the mid-band group. Alternatively, the bands A and B may be included in the mid- or high-band group while the band C is included in the low-band group.

The radio-frequency circuit 1 is illustrated by way of example in FIG. 1 and is not limited thereto. For example, the bands covered by the radio-frequency circuit 1 are not limited to the bands A to C. For example, the radio-frequency circuit 1 may be configured to cover four bands or more. In this case, the radio-frequency circuit 1 may include filters for bands D, E, F . . . . Alternatively, for example, the radio-frequency circuit 1 may be configured to cover only the bands A and B but not the band C. In this case, the radio-frequency circuit 1 does not need to include the power amplifier 12, low-noise amplifier 22, matching networks 441, 442, 451, and 452, radio-frequency input terminal 112, and radio-frequency output terminal 122. For example, the radio-frequency circuit 1 may be a send-only circuit. In this case, the radio-frequency circuit 1 does not need to include the low-noise amplifiers 21 and 22, matching networks 431 to 433 and 451 to 452, switch 53, filters 63 and 65, and radio-frequency output terminals 121 and 122. Alternatively, for example, the radio-frequency circuit 1 may be a receive-only circuit. In this case, the radio-frequency circuit 1 does not need to include the power amplifiers 11 and 12, matching networks 411 to 413 and 441 to 442, switch 52, filters 61 and 64, and radio-frequency input terminals 111 and 112.

The radio-frequency circuit 1 does not need to include all the matching networks 401, 411 to 413, 422, 431 to 433, 441 to 442, and 451 to 452. Furthermore, the radio-frequency circuit 1 may be coupled to plural antennas and may include plural antenna connection terminals, for example. The radio-frequency circuit 1 may include more radio-frequency input terminals. In this case, a switch that is able to switch connections between the power amplifiers and the plural radio-frequency input terminals may be provided between the power amplifiers and the plural radio-frequency input terminals. The radio-frequency circuit 1 may include more radio-frequency output terminals. In this case, a switch that is able to switch connections between the low-noise amplifiers and the plural radio-frequency output terminals may be provided between the low-noise amplifiers and the plural radio-frequency output terminals.

2 Example of Radio-frequency Circuit 1

2.1 Example 1

As Example 1 of the radio-frequency circuit 1 according to the embodiment, a radio-frequency module 1A, in which the radio-frequency circuit 1 is implemented, is described with reference to FIGS. 2 to 6. In Example 1, an electronic component including the filter 61, a chip inductor constituting the matching network 411, and an integrated circuit 50 including the switch 51 are examples of a first electronic component, a second electronic component, and a third electronic component, respectively.

2.1.1 Component Arrangement of Radio-frequency Module 1A

Figure 2:
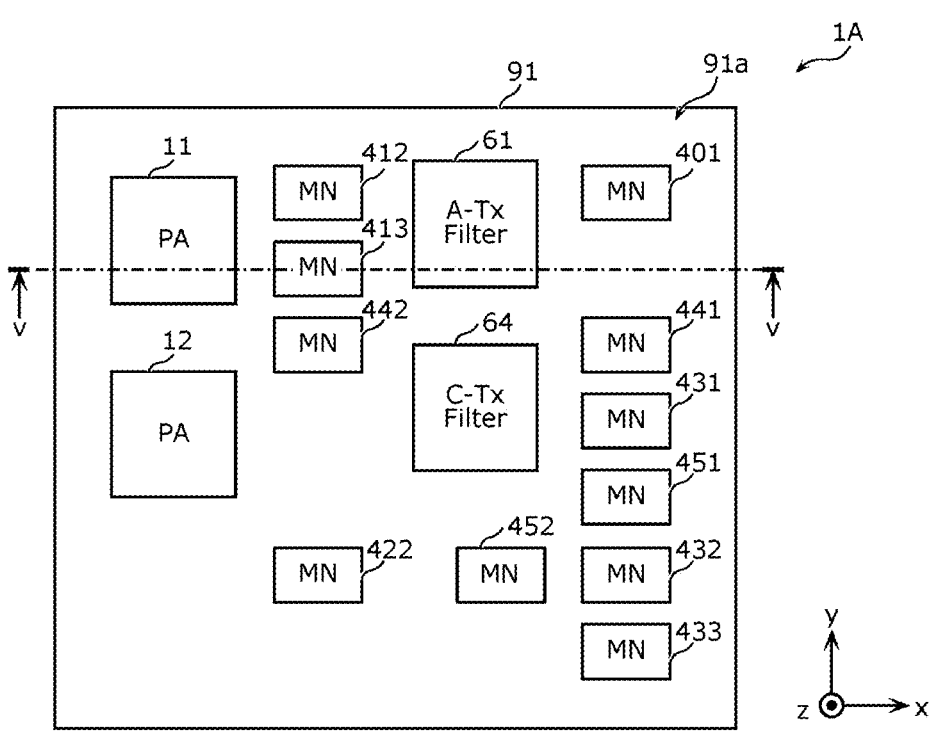
FIG. 2 is a plan view of a first major surface of a radio-frequency module according to Example 1.
Figure 3:
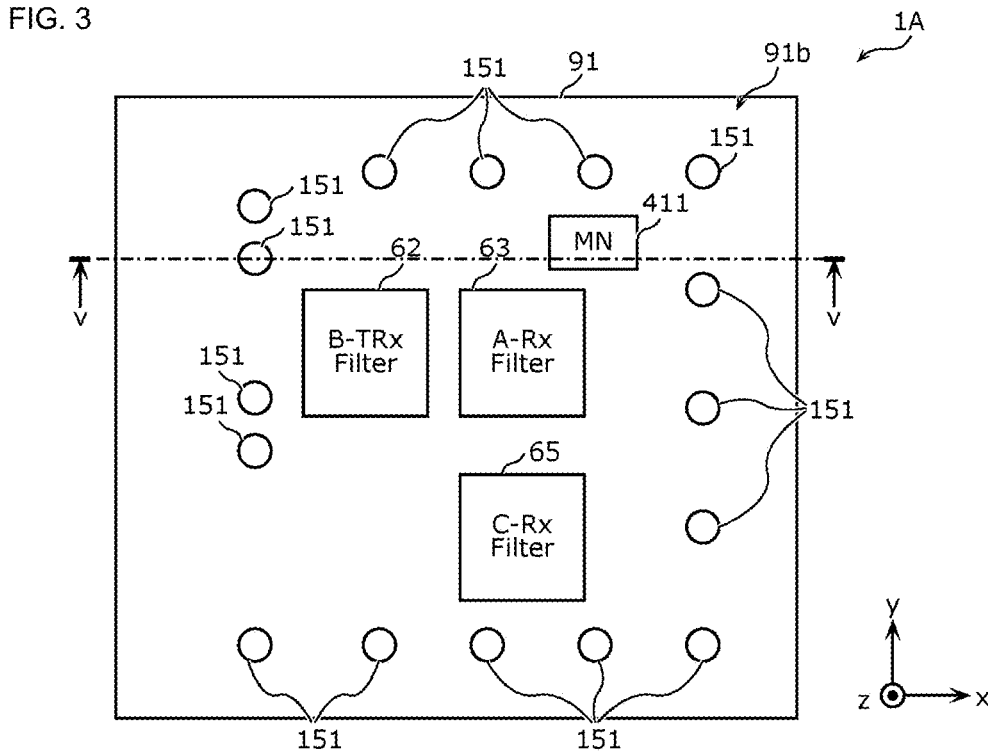
FIG. 3 is a plan view of a second major surface of the radio-frequency module according to Example 1.
Figures 4, 5:
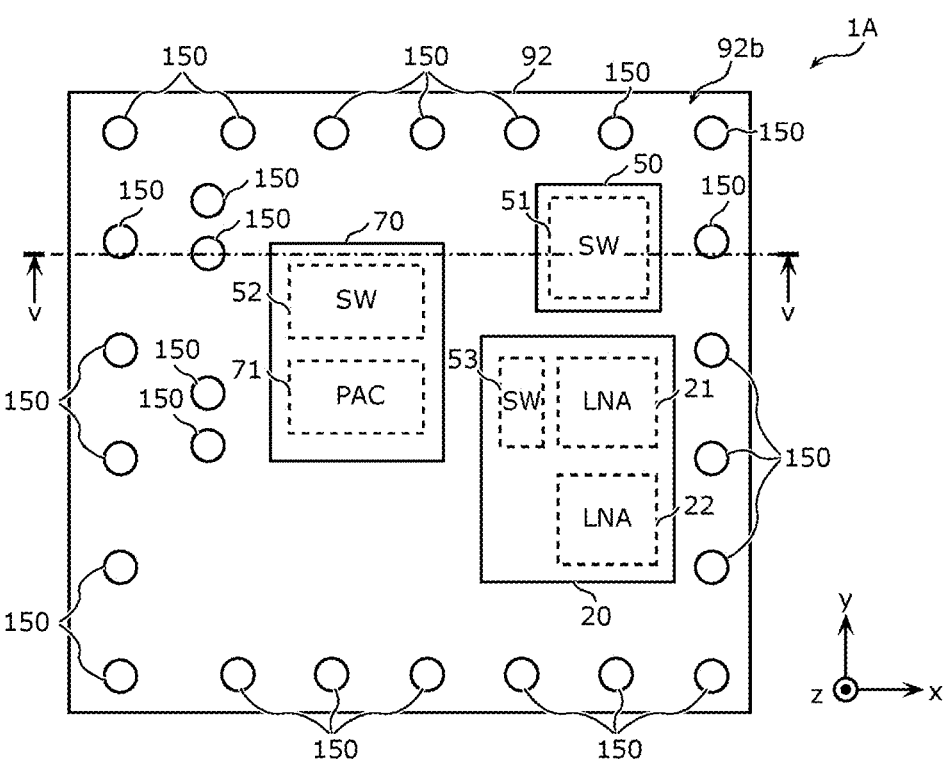
FIG. 4 is a plan view of a fourth major surface of the radio-frequency module according to Example 1.
FIG. 5 is a cross-sectional view of the radio-frequency module according to Example 1.
Figure 6:
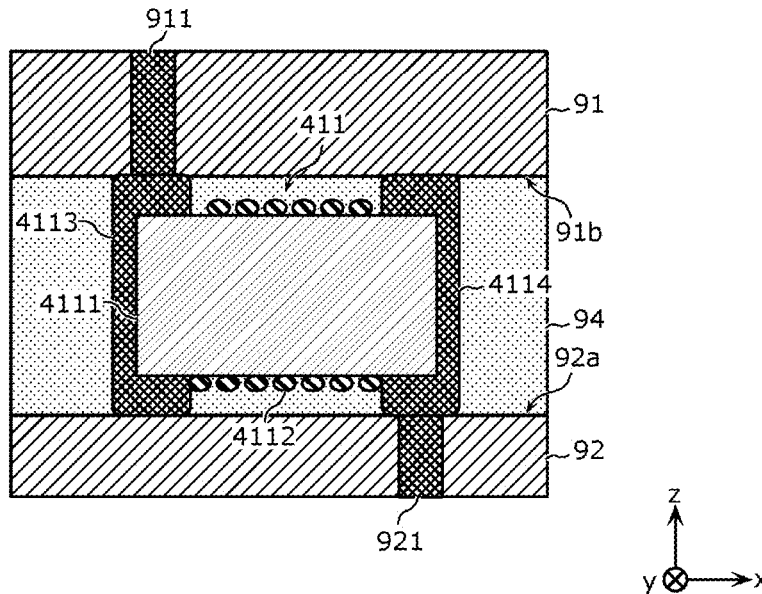
FIG. 6 is an enlarged cross-sectional view of a chip inductor and its periphery in Example 1.

FIG. 2 is a plan view of a major surface 91a of the radio-frequency module 1A according to Example 1. FIG. 3 is a plan view of a major surface 91b of the radio-frequency module 1A according to Example 1. FIG. 3 is a view seen through the major surface 91b side of a module substrate 91 as seen in the positive z-axis direction. FIG. 4 is a plan view of a major surface 92b of the radio-frequency module 1A according to Example 1. FIG. 4 is a view seen through the major surface 92b side of a module substrate 92 as seen in the positive z-axis direction. FIG. 5 is a cross-sectional view of the radio-frequency module 1A according to Example 1. FIG. 6 is an enlarged cross-sectional view of a chip inductor and its periphery in Example 1. The cross sections of the radio-frequency module 1A in FIGS. 5 and 6 are taken along a line v-v of FIGS. 2 to 4.

FIGS. 2 to 5 do not illustrate traces connecting plural electronic components disposed in the module substrates 91 and 92. FIGS. 2 to 4 do not illustrate resin members 93 to 95 covering plural electronic components and a shield electrode layer 96, which covers the surfaces of the resin members 93 to 95.

In addition to the plural electronic components including the plural circuit elements illustrated in FIG. 1, the radio-frequency module 1A includes the module substrates 91 and 92, the resin members 93 to 95, the shield electrode layer 96, plural external connection terminals 150, and plural inter-substrate connection terminals 151.

The module substrate 91 is an example of a first module substrate and includes the major surfaces 91a and 91b, which are opposite to each other. The major surfaces 91a and 91b are examples of first and second major surfaces, respectively.

The module substrate 92 is an example of a second module substrate and includes the major surfaces 92a and 92b, which are opposite to each other. The major surfaces 92a and 92b are examples of third and fourth major surfaces, respectively.

The module substrates 91 and 92 are disposed so that the major surface 91b of the module substrate 91 faces the major surface 92a of the module substrate 92. The module substrates 91 and 92 are disposed at such a distance that the electronic components can be disposed between the major surfaces 91b and 92a. The plural electronic components are disposed in the two module substrates 91 and 92 and, specifically, are separated into three layers: between the major surfaces 91b and 92a; on the major surface 91a; and on the major surface 92b.

In FIGS. 2 to 5, the module substrates 91 and 92 have rectangular shapes of the same size in a planar view. The module substrates 91 and 92 may have different sizes and/or different shapes. The shapes of the module substrates 91 and 92 are not limited to rectangles.

Each of the module substrates 91 and 92 can be, but not limited to, a low temperature co-fired ceramic (LTCC) substrate or a high temperature co-fired ceramic (HTCC) substrate, which includes a laminate structure of plural dielectric layers, an embedded printed circuit board, a substrate including a redistribution layer (RDL), a printed circuit board, or the like, for example.

On the major surface 91a (the upper layer), plural electronic components including the power amplifiers 11 and 12, matching networks 401, 412, 413, 422, 431 to 433, 441, 442, 451, and 452, and filters 61 and 64 are disposed.

Each of the two electronic components including the respective power amplifiers 11 and 12 is composed of a complementary metal oxide semiconductor (CMOS), for example, and specifically, may be manufactured by a silicon-on-insulator (SOI) process. The power amplifiers 11 and 12 can thereby be manufactured at low cost. The two electronic components including the respective power amplifiers 11 and 12 may be composed of at least one of gallium arsenide (GaAs), silicon germanium (SiGe), and gallium nitride (GaN). This can implement the power amplifiers 11 and 12 of high quality.

Each of the matching networks 401, 412, 413, 422, 431 to 433, 441, 442, 451, and 452 is composed of a chip inductor. The chip inductors are surface mount devices (SMDs) each constituting an inductor.

Each matching network may include a chip capacitor and/or a chip resistor, instead of or in addition to a chip inductor. The chip capacitor is an SMD constituting a capacitor. The chip resistor is an SMD constituting a resistor. All the matching networks are not necessarily surface-mounted. For example, at least one of the inductor, capacitor, and resistor included in any matching network may be formed within the module substrate 91 and/or 92.

The electronic component including the filter 61 is an example of the first electronic component. The electronic component including the filter 61 may be composed of, but not limited to, any one of a surface acoustic wave (SAW) filter, a bulk acoustic wave (BAW) filter, an LC resonance filter, and a dielectric filter, for example.

The electronic component including the filter 64 may be composed of, but not limited to, any one of a surface acoustic wave (SAW) filter, a bulk acoustic wave (BAW) filter, an LC resonance filter, and a dielectric filter, for example.

The resin member 93 covers the major surface 91a and plural electronic components on the major surface 91a. The resin member 93 has a function of enhancing the reliability, including mechanical strength and moisture resistance, of the plural electronic components on the major surface 91a. The resin member 93 does not need to be included in the radio-frequency module 1A.

Between the major surfaces 91b and 92a (the middle layer), plural electronic components including the filters 62, 63, and 65 and matching network 411 and the plural inter-substrate connection terminals 151 are disposed. Between the major surfaces 91b and 92a, the resin member 94 is inserted and covers the plural electronic components disposed between the major surfaces 91b and 92a.

Each of the electronic components including the respective filters 62, 63, and 65 may be composed of, but not limited to, any one of a SAW filter, a BAW filter, an LC resonance filter, or a dielectric filter, for example. Each of the electronic components including the respective filters 62, 63, and 65 includes electrodes provided on the side facing the module substrate 91 and is electrically coupled to the module substrate 91 via the electrodes.

The matching network 411 is composed of a chip inductor. In Example 1, the chip inductor constituting the matching network 411 is an example of the second electronic component. As illustrated in FIG. 6, the chip inductor includes a core material 4111, a winding 4112 wound around the core material 4111, and electrodes 4113 and 4114.

The electrode 4113 is an example of a first electrode. The electrode 4113 is joined to the major surface 91b and is coupled to a via conductor 911, which couples the major surfaces 91a and 91b of the module substrate 91. The chip inductor is coupled via the electrode 4113 and via conductor 911 to the electronic component including the filter 61. The electrode 4113 does not need to be directly coupled to the via conductor 911 and may be coupled to the via conductor 911 with a planar electrode pattern interposed therebetween.

The electrode 4114 is an example of a second electrode. The electrode 4114 is joined to the major surface 92a and is coupled to a via conductor 921, which couples the major surfaces 92a and 92b of the module substrate 92. The chip inductor is coupled via the electrode 4114 and via conductor 921 to the integrated circuit 50 including the switch 51. The electrode 4114 does not need to be directly coupled to the via conductor 921 and may be coupled to the via conductor 921 with a planar electrode pattern interposed therebetween.

In a planar view, at least a part of the chip inductor (the second electronic component) constituting the matching network 411 overlaps at least a part of the electronic component (the first electronic component) including the filter 61, which is disposed on the major surface 91a. In a planar view, at least a part of the chip inductor (the second electronic component) constituting the matching network 411 overlaps at least a part of the integrated circuit 50 (the third electronic component), which is disposed on the major surface 92b.

The chip inductor is a wire wound type chip inductor in Example 1 but is not limited thereto. The chip inductor may be, for example, a laminated chip inductor or a film chip inductor. The configuration of the wire wound type chip inductor is not limited to the configuration in FIG. 6.

The matching network 411 may include a chip capacitor and/or a chip resistor, instead of or in addition to the chip inductor. In this case, the chip capacitor and/or chip resistor may be disposed between the major surfaces 91b and 92a in a similar manner to the aforementioned chip inductor and may include the first electrode joined to the major surface 91b and the second electrode joined to the major surface 92a.

The plural inter-substrate connection terminals 151 are electrodes for electrically coupling the module substrates 91 and 92. Some of the inter-substrate connection terminals 151 overlap the power amplifier 11 or 12 in a planar view and are coupled to the external connection terminals 150 to serve as heat dissipation electrodes of the power amplifiers 11 and 12. The inter-substrate connection terminals 151 are composed of copper post electrodes, for example. The shape and material of the inter-substrate connection terminals 151 are not limited thereto.

The resin member 94 covers the major surfaces 91b and 92a and plural electronic components between the major surfaces 91b and 92a. The resin member 94 has a function of enhancing the reliability, including mechanical strength and moisture resistance, of the plural electronic components between the major surfaces 91b and 92a. The resin member 94 does not need to be included in the radio-frequency module 1A.

On the major surface 92b (the lower layer), the integrated circuit 20 including the low-noise amplifiers 21 and 22 and switch 53, the integrated circuit 50 including the switch 51, the integrated circuit 70 including the switch 52 and PA controller 71, and the plural external connection terminals 150 are disposed. The integrated circuit 50 including the switch 51 is an example of the third electronic component.

Each of the integrated circuits 20, 50, and 70 is composed of a CMOS, for example, and specifically, may be manufactured by a SOI process. Each of the integrated circuits 20, 50, and 70 may be composed of at least one of GaAs, SiGe, and GaN. In each of the integrated circuits 20, and 70, the circuit elements are formed in the surface on the side facing the module substrate 92.

As described above, the integrated circuits 20, 50, and are disposed on the major surface 92b, and the filters 61 to 65 and matching networks (chip inductors) 401, 411 to 413, 422, 431 to 433, 441, 442, 451, and 452 are not disposed on the major surface 92b. This means that, of the plural electronic components, the electronic components that can be formed by cutting are disposed on the major surface 92b. The lower surface of the radio-frequency module 1A can therefore be formed by cutting, and the thicknesses of the resin member 95 and integrated circuits 20, 50, and 70 can be reduced.

The plural external connection terminals 150 include the antenna connection terminal 100, radio-frequency input terminals 111 and 112, radio-frequency output terminals 121 and 122, and control terminal 131, which are illustrated in FIG. 1, and further include ground terminals. The plural external connection terminals 150 are individually joined to input-output terminals, a ground terminal, and/or other terminals on a motherboard 1000, which is laid in the negative z-axis direction with respect to the radio-frequency module LA. The plural external connection terminals 150 can be copper post electrodes, for example. However, the shape and material of the external connection terminals 150 are not limited thereto. Some of the plural external connection terminals 150 overlap the power amplifier 11 or 12 in a planar view and serve as heat dissipation electrodes of the power amplifiers 11 and 12 together with the inter-substrate connection terminals 151 coupled to the power amplifiers 11 and 12.

The resin member 95 covers the major surface 92b and the plural electronic components on the major surface 92b. The resin member 95 has a function of enhancing the reliability, including mechanical strength and moisture resistance, of the plural electronic components on the major surface 92b. The resin member 95 does not need to be included in the radio-frequency module 1A.

The shield electrode layer 96 is a metallic thin film formed by sputtering, for example. The shield electrode layer 96 is formed so as to cover the upper surface of the resin member 93 and lateral faces of the resin members 93 to 95 and module substrates 91 and 92. The shield electrode layer 96 is coupled to the ground and inhibits external noise from entering the electronic components constituting the radio-frequency module 1A. The shield electrode layer 96 does not need to be included in the radio-frequency module 1A.

2.1.2 Effect of Radio-frequency Module 1A

As described above, the radio-frequency module 1A according to Example 1 includes: the module substrate 91, which includes the major surfaces 91a and 91b opposite to each other; the module substrate 92, which includes the major surfaces 92a and 92b opposite to each other, the major surface 92a being disposed facing the major surface 91b; the plural electronic components disposed between the major surfaces 91b and 92a, on the major surfaces 91a, and on the major surface 92b; and the external connection terminals 150, which are disposed on the major surface 92b. The plural electronic components include: the first electronic component (the electronic component including the filter 61, for example) disposed on the major surface 91a; the second electronic component (the chip inductor constituting the matching network 411, for example) that includes the first electrode (the electrode 4113, for example) joined to the major surface 91b and the second electrode (the electrode 4114, for example) joined to the major surface 92a and that is disposed between the major surfaces 91b and 92a; and the third electronic component (the integrated circuit 50 including the switch 51, for example) disposed on the major surface 92b. The second electronic component is at least one of a chip inductor, a chip capacitor, and a chip resistor. The second electronic component is coupled via the first electrode to the first electronic component and is coupled via the second electrode to the third electronic component or any external connection terminal 150.

According to such a configuration, the plural electronic components are disposed in three layers, including between the major surfaces 91b and 92a, on the major surface 91a, and on the major surface 92b. This can implement reduction in area of the radio-frequency module 1A in a planar view, that is, reduction in size of the radio-frequency module 1A. Furthermore, the second electronic component disposed between the two module substrates 91 and 92 is joined to the major surface 91b of the module substrate 91 via the first electrode and is joined to the major surface 92a of the module substrate 92 via the second electrode. The second electronic component can be coupled to the first electronic component disposed on the major surface 91a without using any inter-substrate connection terminal 151 and can be coupled to the third electronic component or any external connection terminal 150 that is disposed on the major surface 92b of the module substrate 92 without using any inter-substrate connection terminal 151. The trace length between the first electronic component and the third electronic component or external connection terminal 150 that are coupled via the second electronic component can be reduced in the radio-frequency module 1A. This can reduce the mismatch loss due to the wiring loss and variation in trace, thus improving the electric characteristics of the radio-frequency module 1A.

In the radio-frequency module 1A according to Example 1, for example, at least a part of the second electronic component may overlap at least a part of the first electronic component in a planar view.

This can further reduce the trace length between the first electronic component and the second electronic component.

In the radio-frequency module 1A according to Example 1, for example, in a planar view, at least a part of the second electronic component may overlap at least a part of the third electronic component or external connection terminal 150 that is coupled to the second electronic component via the second electrode.

This can further reduce the trace length between the second electronic component and the third electronic component or external connection terminal 150.

In the radio-frequency module 1A according to Example 1, for example, at least one of a chip inductor, a chip capacitor, and a chip resistor may constitute the matching network 411 and may be coupled to the third electronic component via the electrode 4114. The first electronic component may include the filter 61, and the third electronic component may include the switch 51. The matching network 411 may be coupled between the filter 61 and the switch 51, and the switch 51 may be coupled between the matching network 411 and the antenna connection terminal 100.

This can reduce the trace length between the filter 61 and the switch 51, which are coupled via the matching network 411.

The communication device 5 according to Example 1 includes: the RFIC 3, which processes radio-frequency signals; and the radio-frequency module 1A, which transfers radio-frequency signals between the RFIC 3 and the antenna 2.

According to such a configuration, the effects of the radio-frequency module 1A can be implemented in the communication device 5.

2.2 Example 2

Next, a radio-frequency module 1B, in which the radio-frequency circuit 1 is implemented, is described as Example 2 of the radio-frequency circuit 1 according to the above-described embodiment. Example 2 is different from Example 1 described above mostly in the combination of the first electronic component, second electronic component, and third electronic component. The following description of the radio-frequency module 1B according to Example 2 focuses different points from Example 1 with reference to FIGS. 7 to 12.

2.2.1 Component Position of Radio-frequency Module 1B

Figure 7:
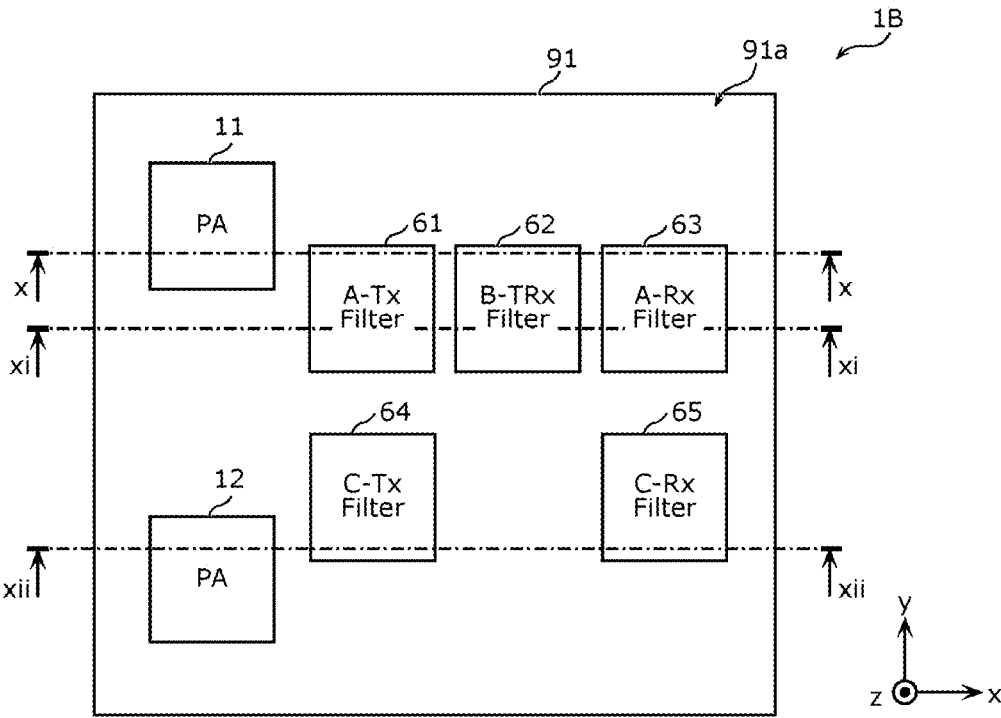
FIG. 7 is a plan view of a first major surface of a radio-frequency module according to Example 2.
Figure 8:
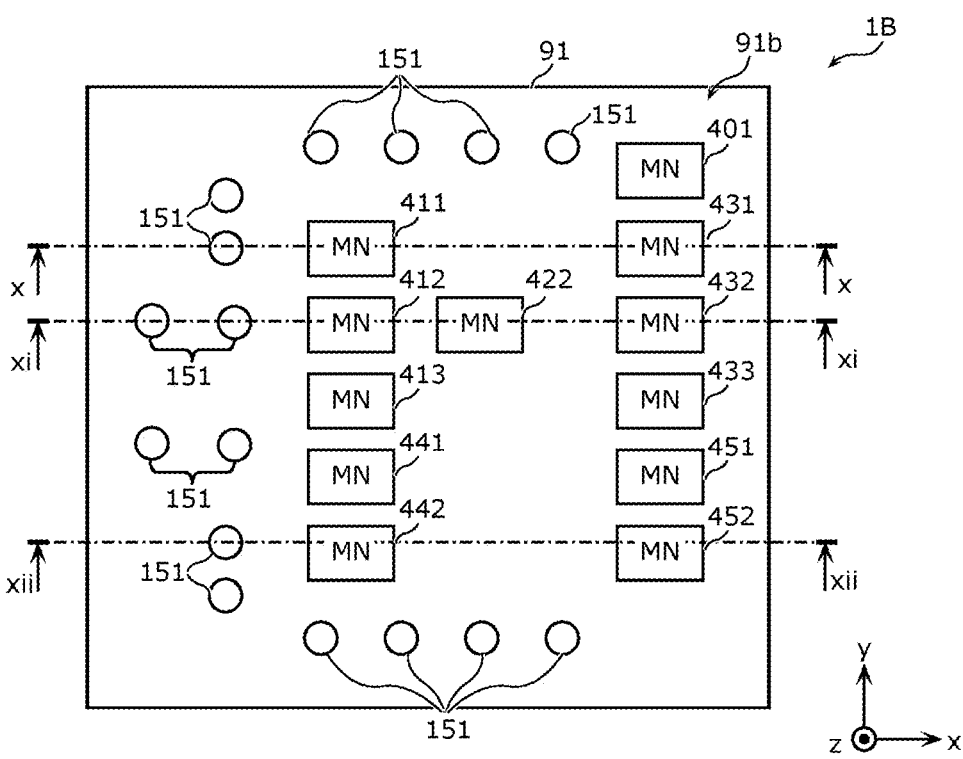
FIG. 8 is a plan view of a second major surface of a radio-frequency module according to Example 2.
Figure 9:
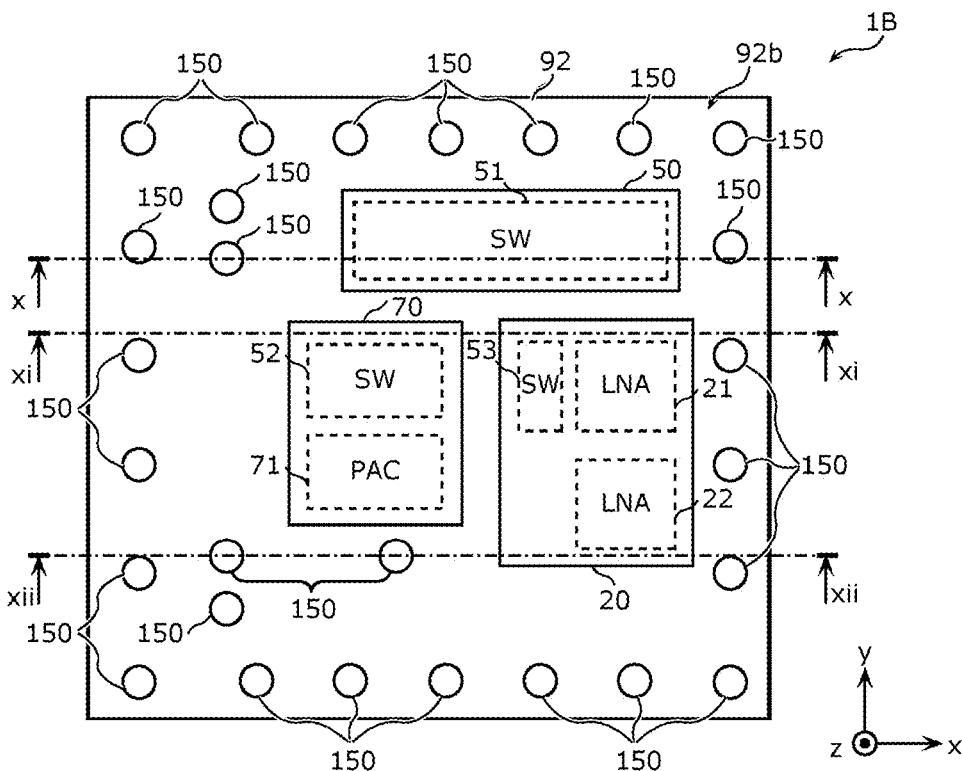
FIG. 9 is a plan view of a fourth major surface of the radio-frequency module according to Example 2.
Figure 10:
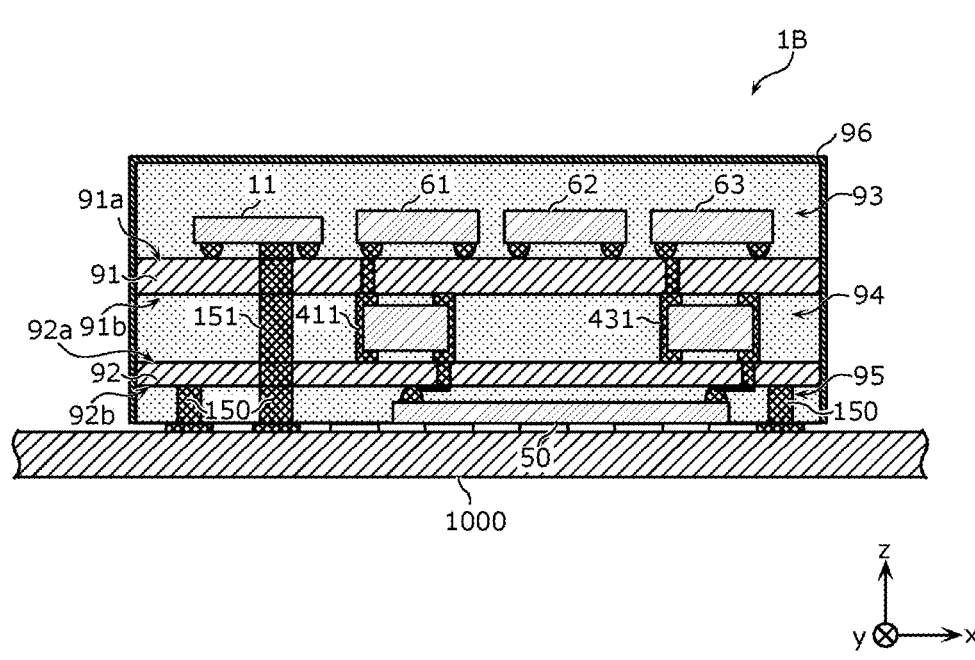
FIG. 10 is a cross-sectional view of the radio-frequency module according to Example 2.
Figure 11:
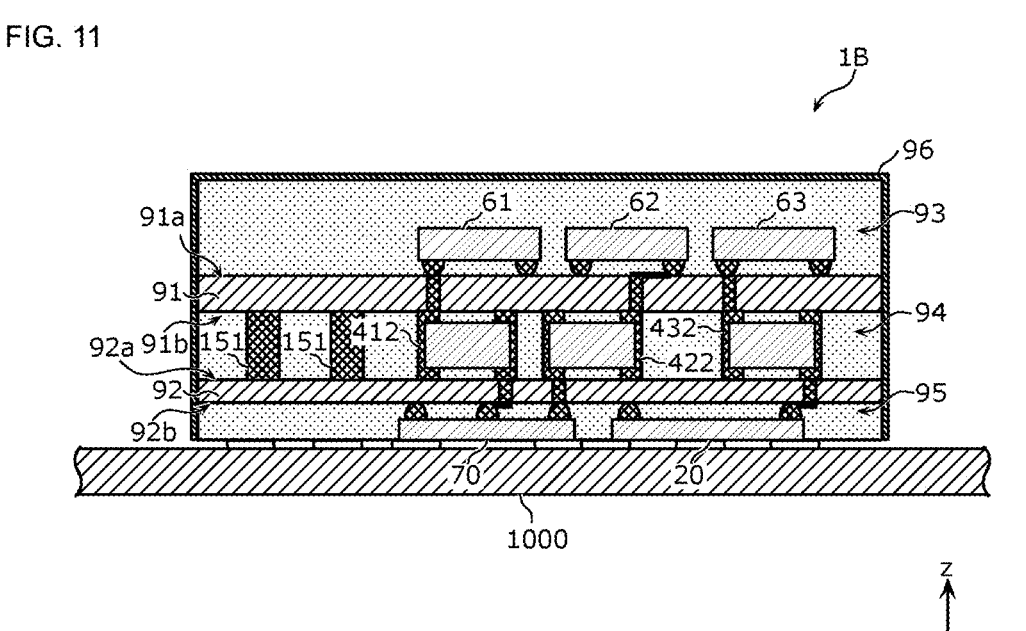
FIG. 11 is another cross-sectional view of the radio-frequency module according to Example 2.
Figure 12:
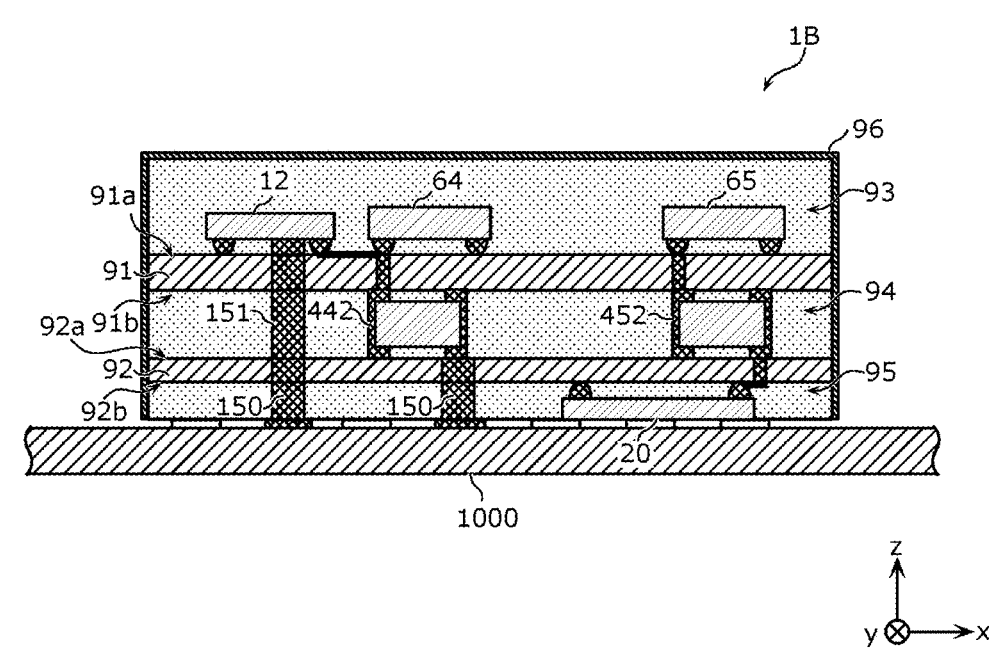
FIG. 12 is still another cross-sectional view of the radio-frequency module according to Example 2.

FIG. 7 is a plan view of the major surface 91a of the radio-frequency module 1B according to Example 2. FIG. 8 is a plan view of the major surface 91b of the radio-frequency module 1B according to Example 2. FIG. 8 is a view seen through the major surface 91b side of the module substrate 91 as seen in the positive z-axis direction. FIG. 9 is a plan view of the major surface 92b of the radio-frequency module 1B according to Example 2. FIG. 9 is a view seen through the major surface 92b side of the module substrate 92 as seen in the positive z-axis direction. FIGS. 10 to 12 are cross-sectional views of the radio-frequency module 1B according to Example 2. The cross section of the radio-frequency module 1B in FIG. 10 is taken along a line x-x of FIGS. 7 to 9. The cross section of the radio-frequency module 1B in FIG. 11 is taken along a line xi-xi of FIGS. 7 to 9. The cross section of the radio-frequency module 1B in FIG. 12 is taken along a line xii-xii of FIGS. 7 to 9.

On the major surface 91a (the upper layer), the power amplifiers 11 and 12 and filters 61 to 65 are disposed. In Example 2, each of the filters 61 to 65 is an example of the first electronic component.

Between the major surfaces 91b and 92a (the middle layer), the matching networks (the chip inductors) 401, 411 to 413, 422, 431 to 433, 441, 442, 451, and 452 and plural inter-substrate connection terminals 151 are disposed. In Example 2, the chip inductor constituting each of the matching networks 411, 412, 422, 431, 432, 442, and 452 is an example of the second electronic component and includes the first electrode joined to the major surface 91b and the second electrode coupled to the major surface 92a.

As illustrated in FIG. 10, the chip inductor constituting the matching network 411 is coupled via the first electrode to the electronic component including the filter 61 and is coupled via the second electrode to the integrated circuit 50 including the switch 51. In a planar view, at least a part of the chip inductor constituting the matching network 411 overlaps at least a part of the electronic component including the filter 61. Furthermore, in a planar view, at least a part of the chip inductor constituting the matching network 411 overlaps at least a part of the integrated circuit 50 including the switch 51.

As illustrated in FIG. 11, the chip inductor constituting the matching network 412 is coupled via the first electrode to the electronic component including the filter 61 and is coupled via the second electrode to the integrated circuit 70 including the switch 52. In a planar view, at least a part of the chip inductor constituting the matching network 412 overlaps at least a part of the electronic component including the filter 61. Furthermore, in a planar view, at least a part of the chip inductor constituting the matching network 412 overlaps at least a part of the integrated circuit 70 including the switch 52.

As illustrated in FIG. 11, the chip inductor constituting the matching network 422 is coupled via the first electrode to the electronic component including the filter 62 and is coupled via the second electrode to the integrated circuit 70 including the switch 52. In a planar view, at least a part of the chip inductor constituting the matching network 422 overlaps at least a part of the electronic component including the filter 62. Furthermore, in a planar view, at least a part of the chip inductor constituting the matching network 422 overlaps at least a part of the integrated circuit 70 including the switch 52.

As illustrated in FIG. 12, the chip inductor constituting the matching network 442 is coupled via the first electrode to the electronic component including the filter 64 and is coupled via the second electrode to the external connection terminal 150 that serves as a ground terminal. In a planar view, at least a part of the chip inductor constituting the matching network 442 overlaps at least a part of the electronic component including the filter 64. Furthermore, in a planar view, at least a part of the chip inductor constituting the matching network 442 overlaps at least a part of the external connection terminal 150.

As illustrated in FIG. 12, the chip inductor constituting the matching network 452 is coupled via the first electrode to the electronic component including the filter 65 and is coupled via the second electrode to the integrated circuit 20 including the low-noise amplifier 22. In a planar view, at least a part of the chip inductor constituting the matching network 452 overlaps at least a part of the electronic component including the filter 65. Furthermore, in a planar view, at least a part of the chip inductor constituting the matching network 452 overlaps at least a part of the integrated circuit 20 including the low-noise amplifier 22.

On the major surface 92b (the lower layer), the integrated circuits 20, 50, and 70 and plural external terminals 150 are disposed. In Example 2, each of the integrated circuits 20, 50, and 70 is an example of the third electronic component.

Table 1 below indicates combinations of the first electronic component, second electronic component, and third electronic component in Example 2.

TABLE 1

| NO. | FIRST ELECTRONIC COMPONENT | SECOND ELECTRONIC COMPONENT | THIRD ELECTRONIC COMPONENT/EXTERNAL CONNECTION TERMINAL |
|---|---|---|---|
| 1 | FILTER 61 | MATCHING NETWORK 411 | SWITCH 51 |
| 2 | FILTER 61 | MATCHING NETWORK 412 | SWITCH 52 |
| 3 | FILTER 62 | MATCHING NETWORK 422 | SWITCH 52 |
| 4 | FILTER 63 | MATCHING NETWORK 431 | SWITCH 51 |
| 5 | FILTER 63 | MATCHING NETWORK 432 | SWITCH 53 |
| 6 | FILTER 64 | MATCHING NETWORK 442 | EXTERNAL CONNECTION TERMINAL 150 |
| 7 | FILTER 65 | MATCHING NETWORK 452 | LOW-NOISE AMPLIFIER 22 |

As illustrated in FIG. 10, the chip inductor constituting the matching network 431 is coupled via the first electrode to the electronic component including the filter 63 and is coupled via the second electrode to the integrated circuit 50 including the switch 51. In a planar view, at least a part of the chip inductor constituting the matching network 431 overlaps at least a part of the electronic component including the filter 63. Furthermore, in a planar view, at least a part of the chip inductor constituting the matching network 431 overlaps at least a part of the integrated circuit 50 including the switch 51.

As illustrated in FIG. 11, the chip inductor constituting the matching network 432 is coupled via the first electrode to the electronic component including the filter 63 and is coupled via the second electrode to the integrated circuit 20 including the switch 53. In a planar view, at least a part of the chip inductor constituting the matching network 432 overlaps at least a part of the electronic component including the filter 63. Furthermore, in a planar view, at least a part of the chip inductor constituting the matching network 432 overlaps at least a part of the integrated circuit 20 including the switch 53.

2.2.2 Effect of Radio-frequency Module 1B

As described above, in the radio-frequency module 1B according to Example 2, at least one of a chip inductor, a chip capacitor, and a chip resistor may constitute the matching network 411 and may be coupled via the second electrode to the third electronic component. The first electronic component may include the filter 61, and the third electronic component may include the switch 51. The matching network 411 may be coupled between the filter 61 and the switch 51, and the switch 51 may be coupled between the matching network 411 and the antenna connection terminal 100.

In a similar manner, in the radio-frequency module 1B according to Example 2, at least one of a chip inductor, a chip capacitor, and a chip resistor may constitute the matching network 431 and may be coupled via the second electrode to the third electronic component. The first electronic component may include the filter 63, and the third electronic component may include the switch 51. The matching network 431 may be coupled between the filter 63 and the switch 51, and the switch 51 may be coupled between the matching network 431 and the antenna connection terminal 100.

Such a configuration can reduce the trace length between the filter 61 and the switch 51, which are coupled via the matching network 411, and reduce the trace length between the filter 63 and the switch 51, which are coupled via the matching network 431.

In the radio-frequency module 1B according to Example 2, for example, at least one of a chip inductor, a chip capacitor, and a chip resistor may constitute the matching network 412 and may be coupled via the second electrode to the third electronic component. The first electronic component may include the filter 61, and the third electronic component may include the switch 52. The matching network 412 may be coupled between the filter 61 and the switch 52, and the switch 52 may be coupled between the matching network 412 and the power amplifier 11.

In the radio-frequency module 1B according to Example 2, similarly, at least one of a chip inductor, a chip capacitor, and a chip resistor may constitute the matching network 422 and may be coupled via the second electrode to the third electronic component. The first electronic component may include the filter 62, and the third electronic component may include the switch 52. The matching network 422 may be coupled between the filter 62 and the switch 52, and the switch 52 may be coupled between the matching network 422 and the power amplifier 11.

Such a configuration can reduce the trace length between the filter 61 and the switch 52, which are coupled via the matching network 412, and reduce the trace length between the filter 62 and the switch 52, which are coupled via the matching network 422.

In the radio-frequency module 1B according to Example 2, for example, at least one of a chip inductor, a chip capacitor, and a chip resistor may constitute the matching network 432 and may be coupled via the second electrode to the third electronic component. The first electronic component may include the filter 63, and the third electronic component may include the switch 53. The matching network 432 may be coupled between the filter 63 and the switch 53, and the switch 53 may be coupled between the matching network 432 and the low-noise amplifier 21.

Such a configuration can reduce the trace length between the filter 63 and the switch 53, which are coupled via the matching network 432.

In the radio-frequency module 1B according to Example 2, for example, at least one of a chip inductor, a chip capacitor, and a chip resistor may constitute the matching network 452 and may be coupled via the second electrode to the third electronic component. The first electronic component may include the filter 65, and the third electronic component may include the low-noise amplifier 22. The matching network 452 may be coupled between the filter 65 and the low-noise amplifier 22.

Such a configuration can reduce the trace length between the filter 65 and the low-noise amplifier 22, which are coupled via the matching network 452.

The communication device 5 according to Example 2 includes: the RFIC 3, which processes radio-frequency signals; and the radio-frequency module 1B, which transfers radio-frequency signals between the RFIC 3 and the antenna 2.

According to such a configuration, the effects of the radio-frequency module 1B can be implemented in the communication device 5.

2.3 Example 3

Next, a radio-frequency module 1C, in which the radio-frequency circuit 1 is implemented, is described as Example 3 of the radio-frequency circuit 1 according to the above-described embodiment. Example 3 is different from Examples 1 and 2 described above mostly in that the power amplifiers 11 and 12 are disposed between the major surfaces 91b and 92a (the middle layer). The following description of the radio-frequency module 1C according to Example 3 focuses different points from Examples 1 and 2 with reference to FIGS. 13 to 16.

2.3.1 Component Position of Radio-frequency Module 1C

Figure 13:
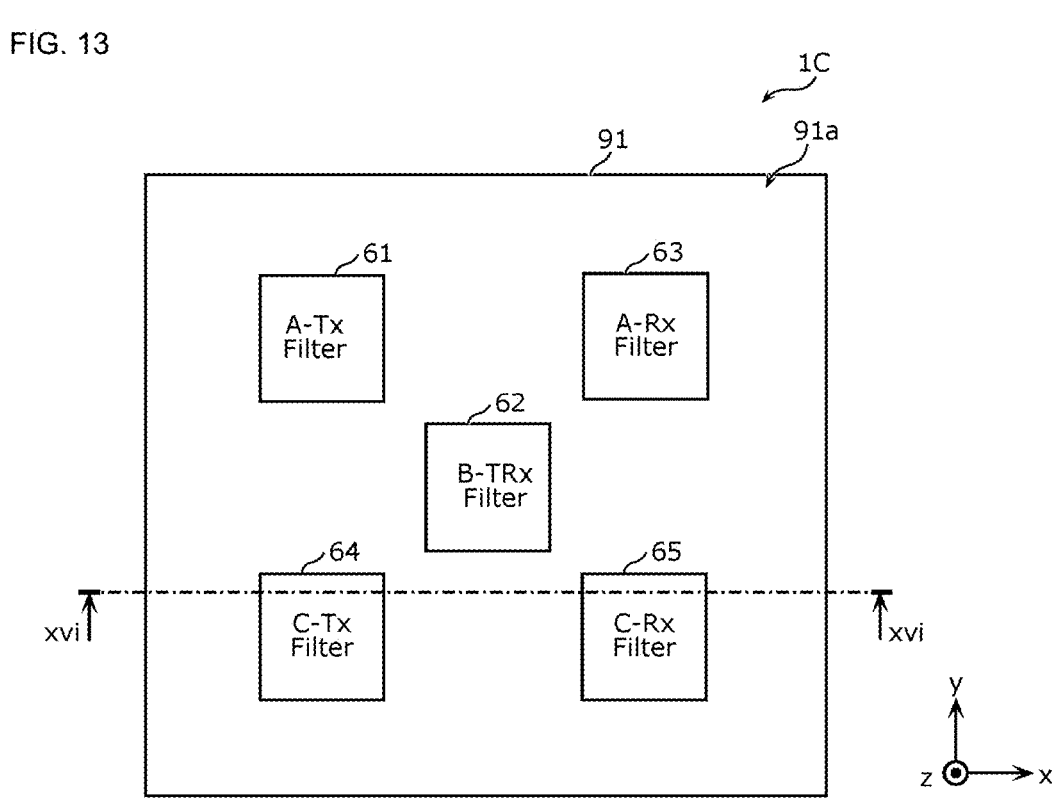
FIG. 13 is a plan view of a first major surface of the radio-frequency module according to Example 3.
Figure 14:
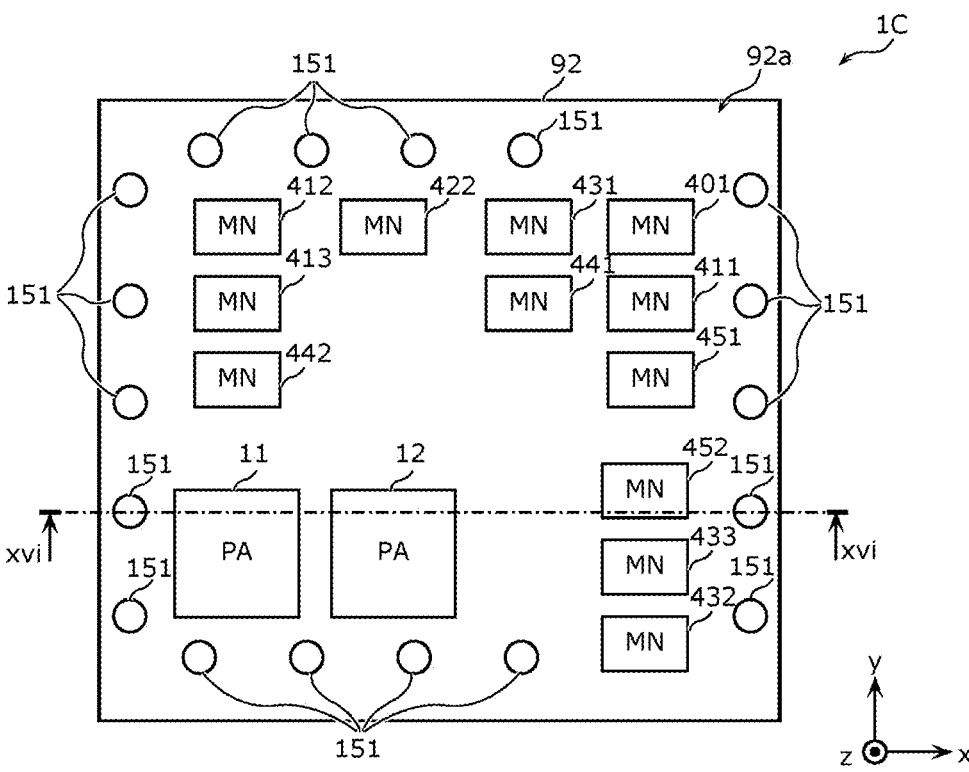
FIG. 14 is a plan view of a third major surface of the radio-frequency module according to Example 3.
Figure 15:
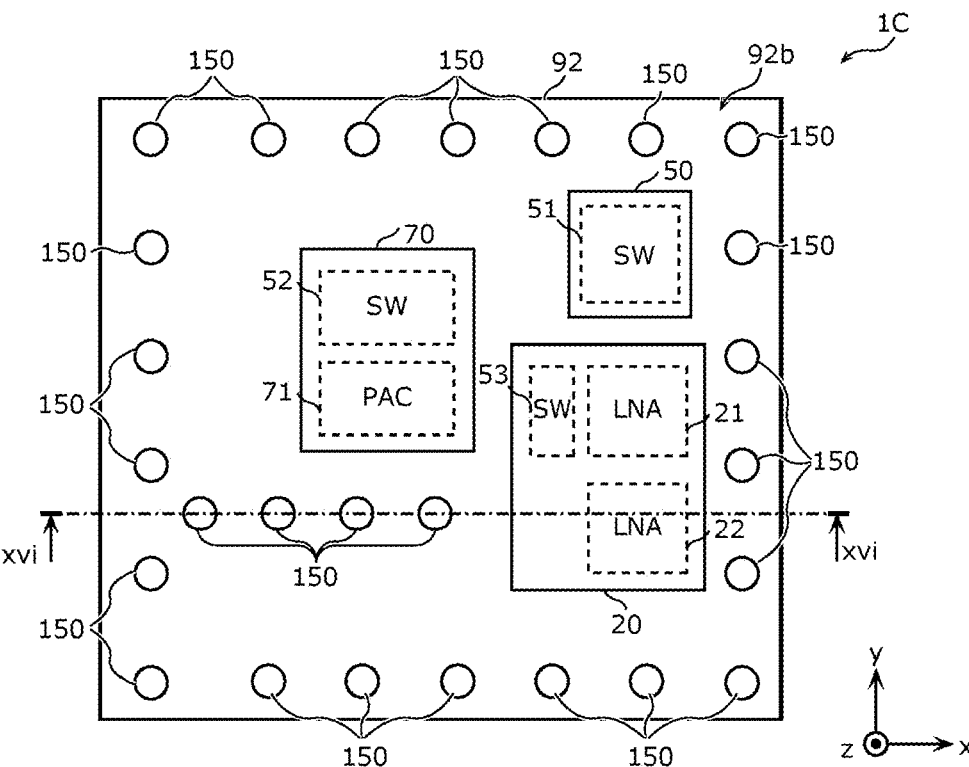
FIG. 15 is a plan view of a fourth major surface of the radio-frequency module according to Example 3.
Figure 16:
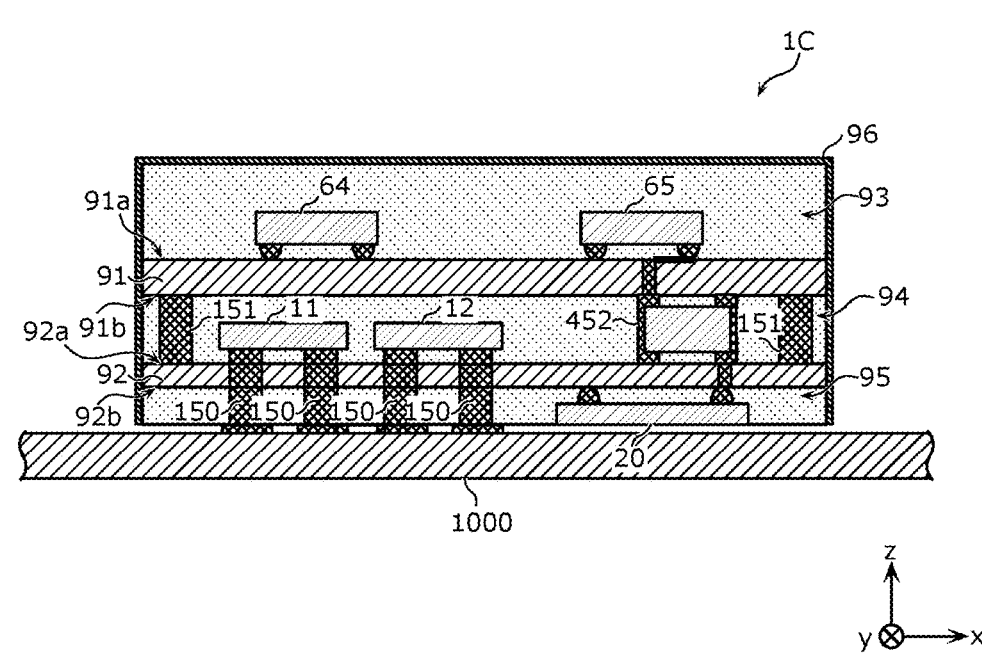
FIG. 16 is a cross-sectional view of the radio-frequency module according to Example 3.

FIG. 13 is a plan view of the major surface 91a of the radio-frequency module 1C according to Example 3. FIG. 14 is a plan view of the major surface 92a of the radio-frequency module 1C according to Example 3. FIG. 14 is a view seen through the major surface 92a side of the module substrate 92 as seen in the positive z-axis direction. FIG. 15 is a plan view of the major surface 92b of the radio-frequency module 1C according to Example 3. FIG. 15 is a view seen through the major surface 92b side of the module substrate 92 as seen in the positive z-axis direction. FIG. 16 is a cross sectional view of the radio-frequency module 1C according to Example 3. The cross section of the radio-frequency module 1C in FIG. 16 is taken along a line xvi-xvi of FIGS. 13 to 15.

On the major surface 91a (the upper layer), the filters 61 to 65 are disposed. In Example 3, the filter 65 is an example of the first electronic component.

Between the major surfaces 91b and 92a (the middle layer), the power amplifiers 11 and 12, matching networks (chip inductors) 401, 411 to 413, 422, 431 to 433, 441, 442, 451, and 452, and plural inter-substrate connection terminals 151 are disposed. In Example 3, the chip inductor constituting the matching network 452 is an example of the second electronic component and includes the first electrode joined to the major surface 91b and the second electrode coupled to the major surface 92a. In each of the two electronic components including the respective power amplifiers 11 and 12, the amplification element is formed in the surface on the side facing the module substrate 92.

On the major surface 92b (the lower layer), the integrated circuit 20 including the low-noise amplifiers 21 and 22 and switch 53, the integrated circuit 50 including the switch 51, the integrated circuit 70 including the switch 52 and PA controller 71, and the plural external connection terminal 150 are disposed. In Example 3, the integrated circuit 20 is an example of the third electronic component. Some of the plural external connection terminals 150 overlap the electronic components including the power amplifiers 11 and 12 in a planar view and serve as heat dissipation electrodes of the power amplifiers 11 and 12.

As illustrated in FIG. 16, the chip inductor constituting the matching network 452 is coupled via the first electrode to the electronic component including the filter 65 and is coupled via the second electrode to the integrated circuit 20 including the low-noise amplifier 22. In a planar view, at least a part of the chip inductor constituting the matching network 452 overlaps at least a part of the electronic component including the filter 65. Furthermore, in a planar view, at least a part of the chip inductor constituting the matching network 452 overlaps at least a part of the integrated circuit 20 including the low-noise amplifier 22.

2.3.2 Effect of Radio-Frequency Module 1C

As described above, in the radio-frequency module 1C according to Example 3, the power amplifiers 11 and 12 may be disposed between the major surfaces 91*b* and 92*a*.

According to such a configuration, the power amplifiers 11 and 12 can be closer to the motherboard 1000 than assuming the power amplifiers 11 and 12 are disposed on the major surface 91*a*. This can shorten the path through which heat generated in the amplification elements of the power amplifiers 11 and 12 is emitted to the motherboard 1000, thus increasing heat dissipation of the power amplifiers 11 and 12.

2.4 Example 4

Next, a radio-frequency module 1D, in which the radio-frequency circuit 1 is implemented, is described as Example 4 of the radio-frequency circuit 1 according to the above-described embodiment. Example 4 is different from Examples 1 and 2 described above mostly in that the power amplifiers 11 and 12 are disposed on the major surface 92*b* (the lower layer). The following description of the radio-frequency module 1D according to Example 4 focuses different points from Examples 1 and 2 with reference to FIGS. 17 to 20.

2.4.1 Component Position of Radio-frequency Module 1D

Figure 17:
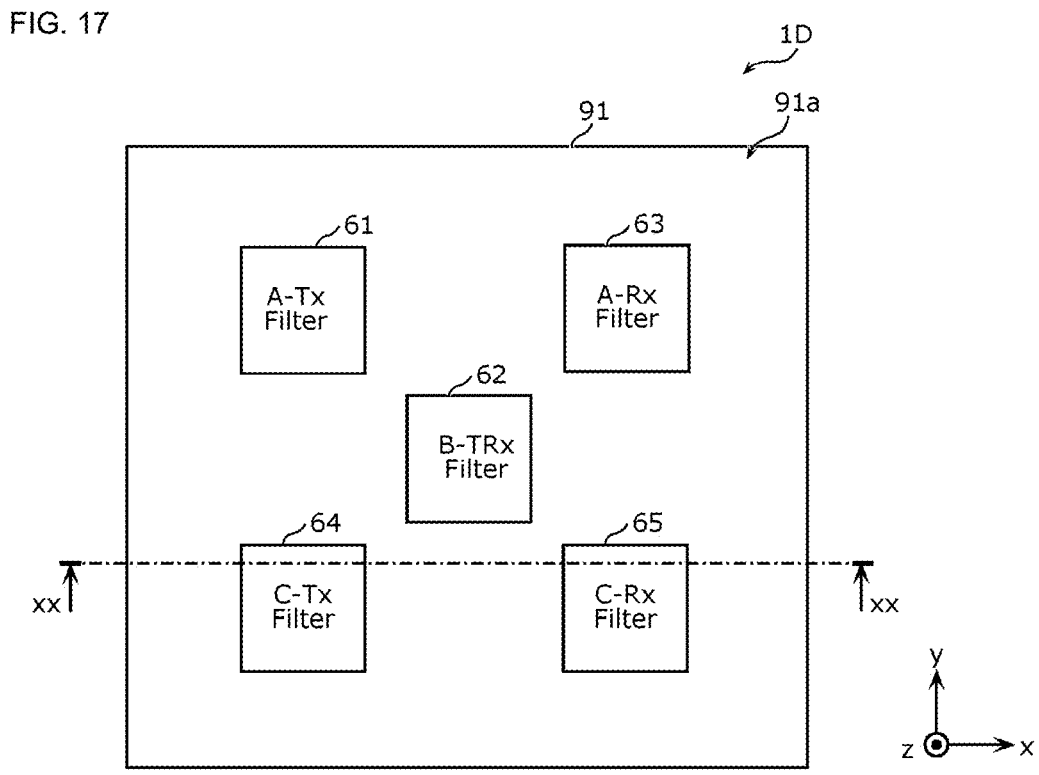
FIG. 17 is a plan view of a first major surface of the radio-frequency module according to Example 4.
Figure 18:
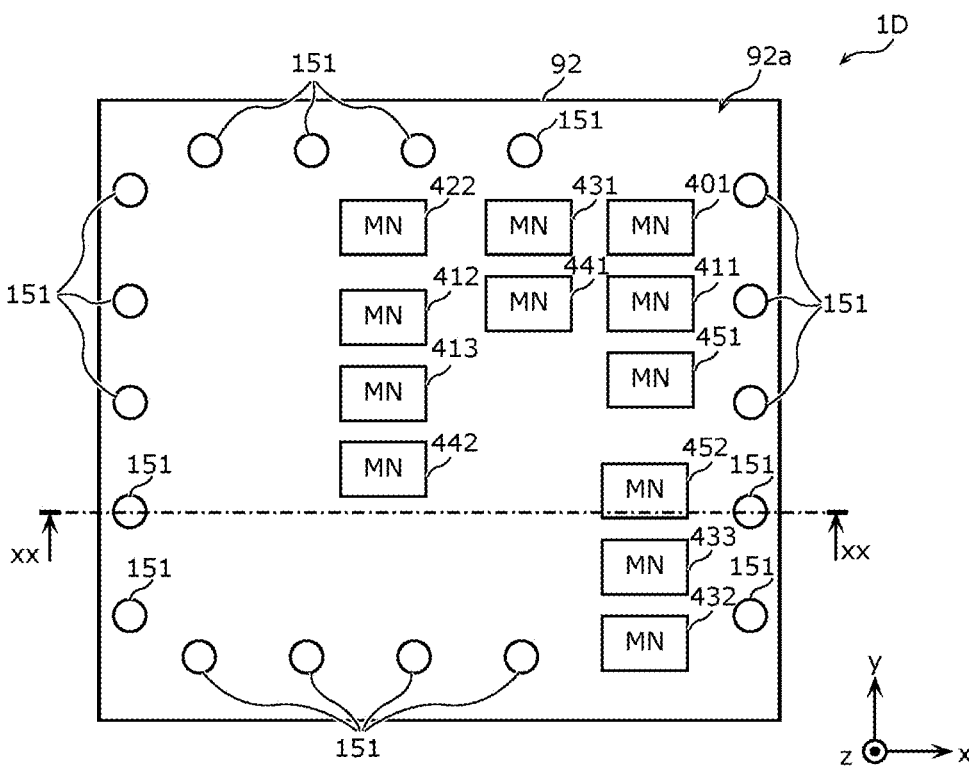
FIG. 18 is a plan view of a third major surface of the radio-frequency module according to Example 4.
Figure 19:
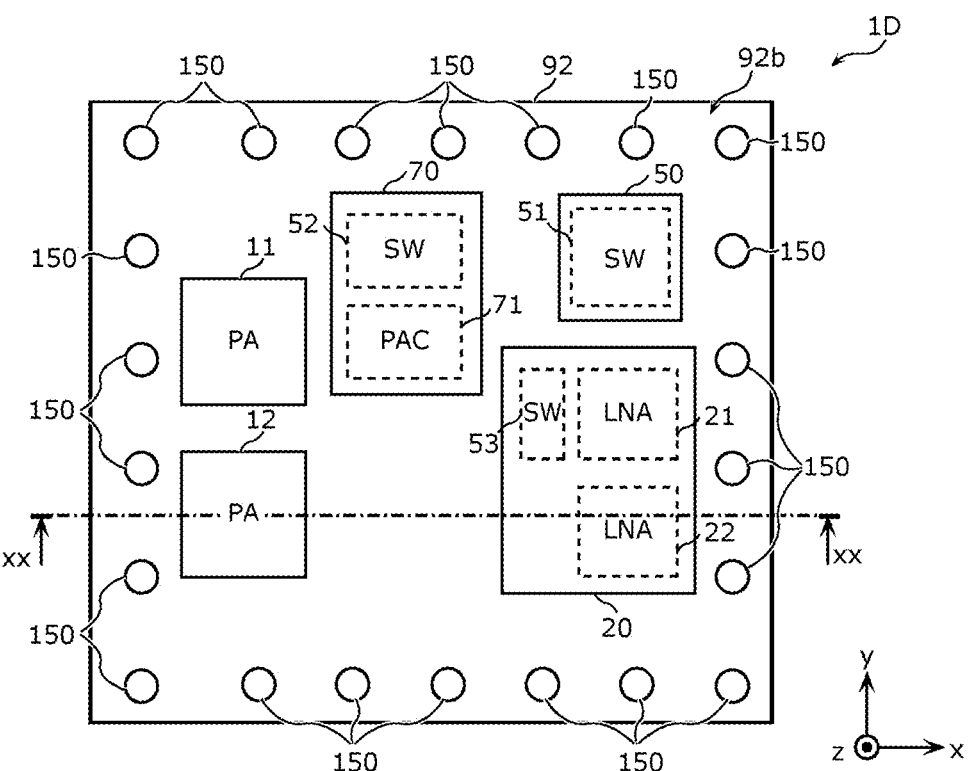
FIG. 19 is a plan view of a fourth major surface of the radio-frequency module according to Example 4.
Figure 20:
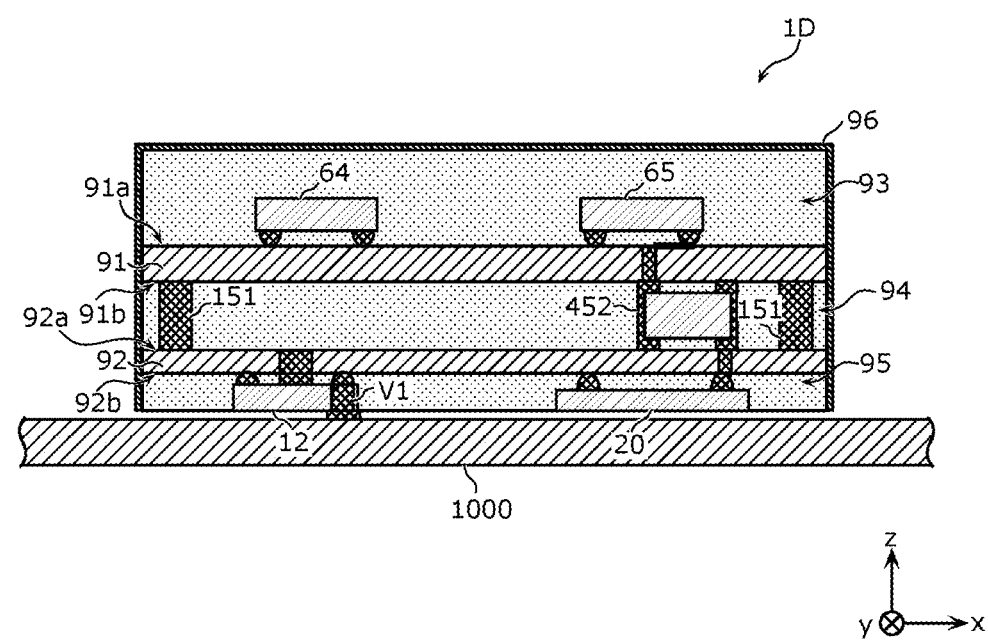
FIG. 20 is a cross-sectional view of the radio-frequency module according to Example 4.

FIG. 17 is a plan view of the major surface 91*a* of the radio-frequency module 1D according to Example 4. FIG. 18 is a plan view of the major surface 92*a* of the radio-frequency module 1D according to Example 4. FIG. 18 is a view seen through the major surface 92*a* side of the module substrate 92 as seen in the positive z-axis direction. FIG. 19 is a plan view of the major surface 92*b* of the radio-frequency module 1D according to Example 4. FIG. 19 is a view seen through the major surface 92*b* side of the module substrate 92 as seen in the positive z-axis direction. FIG. 20 is a cross sectional view of the radio-frequency module 1D according to Example 4. The cross section of the radio-frequency module 1D in FIG. 20 is taken along a line xx-xx of FIGS. 17 to 19.

On the major surface 91*a* (the upper layer), the filters 61 to 65 are disposed. In Example 4, the filter 65 is an example of the first electronic component.

Between the major surfaces 91*b* and 92*a* (the middle layer), the matching networks (the chip inductors) 401, 411 to 413, 422, 431 to 433, 441, 442, 451, and 452 and plural inter-substrate connection terminals 151 are disposed. In Example 4, the chip inductor constituting the matching network 452 is an example of the second electronic component and includes the first electrode joined to the major surface 91*b* and the second electrode coupled to the major surface 92*a*.

On the major surface 92*b* (the lower layer), the power amplifiers 11 and 12, the integrated circuit 20 including the low-noise amplifiers 21 and 22 and switch 53, the integrated circuit 50 including the switch 51, the integrated circuit 70 including the switch 52 and PA controller 71, and the plural external connection terminal 150 are disposed. In Example 4, the integrated circuit 20 is an example of the third electronic component.

In each of the electronic components including the respective power amplifiers 11 and 12, the amplification element is formed in the surface on the side facing the module substrate 92. In each of the electronic components including the power amplifiers 11 and 12, a via conductor V1 for heat dissipation is formed. Heat generated in the amplification element is emitted to the motherboard 1000 through the via conductor V1. The via conductor V1 is not necessarily formed in each of the electronic components including the power amplifiers 11 and 12.

As illustrated in FIG. 20, the chip inductor constituting the matching network 452 is coupled via the first electrode to the electronic component including the filter 65 and is coupled via the second electrode to the integrated circuit 20 including the low-noise amplifier 22. In a planar view, at least a part of the chip inductor constituting the matching network 452 overlaps at least a part of the electronic component including the filter 65. Furthermore, in a planar view, at least a part of the chip inductor constituting the matching network 452 overlaps at least a part of the integrated circuit 20 including the low-noise amplifier 22.

2.4.2 Effect of Radio-frequency Module 1D

As described above, in the radio-frequency module 1D according to Example 4, the power amplifiers 11 and 12 may be disposed on the major surface 92*b*. In the electronic components including the power amplifiers 11 and 12, the via conductor V1 for heat dissipation may be formed.

This can shorten the path through which heat generated in the amplification elements of the power amplifiers 11 and 12 is emitted to the motherboard 1000, thus increasing the heat dissipation of the power amplifiers 11 and 12.

Modification

The radio-frequency module and communication device according to the present disclosure are described based on the embodiment and examples hereinabove but are not limited to the aforementioned embodiment and examples. The present disclosure includes another example implemented by a combination of any constituent elements of the aforementioned examples, modifications obtained by performing for the aforementioned embodiment and examples, various changes that can be conceived by those skilled in the art without departing from the spirit of the present disclosure, and various devices incorporating the aforementioned radio-frequency module.

In the circuit configurations of the radio-frequency circuit and communication device according to the aforementioned embodiments, for example, other circuit elements, traces, and the like may be inserted in paths connecting circuit elements and signal paths disclosed in the drawings. For example, a matching network may be inserted between the switch 51 and the filter 62 and/or between the switch 51 and the filter 65.

The positions of the plural electronic components are illustrated by way of example in Examples above and are not limited to those in Examples. For example, the positions of the first electronic component, second electronic component, and third electronic component may be combined as illustrated in Table 2 below in addition to the combinations illustrated in Table 1 above.

TABLE 2

| NO. | FIRST ELECTRONIC COMPONENT | SECOND ELECTRONIC COMPONENT | THIRD ELECTRONIC COMPONENT/EXTERNAL CONNECTION TERMINAL |
|---|---|---|---|
| 8 | SWITCH 51 | MATCHING NETWORK 401 | ANTENNA CONNECTION TERMINAL 100 |
| 9 | POWER AMPLIFIER 11 | MATCHING NETWORK 413 | SWITCH 52 |
| 10 | LOW-NOISE AMPLIFIER 21 | MATCHING NETWORK 433 | SWITCH 53 |
| 11 | FILTER 64 | MATCHING NETWORK 441 | SWITCH 51 |
| 12 | FILTER 65 | MATCHING NETWORK 451 | SWITCH 51 |

In Combination No. 8, for example, the first electronic component may be the integrated circuit 50 including the switch 51, and the second electronic component may be a chip inductor, a chip capacitor, a chip resistor, or any combination thereof that constitutes the matching network 401. Specifically, at least one of a chip inductor, a chip capacitor, and a chip resistor may constitute the matching network 401 and may be coupled via the second electrode to the external connection terminal 150 used as the antenna connection terminal 100. The first electronic component may include the switch 51, and the matching network 401 may be coupled between the switch 51 and the antenna connection terminal 100. Such a configuration can reduce the trace length between the switch 51 and the antenna connection terminal 100, which are coupled via the matching network 401.

In Combination No. 9, for example, the first electronic component may be the electronic component including the power amplifier 11; the second electronic component may be a chip inductor, a chip capacitor, a chip resistor, or any combination thereof that constitutes the matching network 413; and the third electronic component may be the electronic component including the switch 52. Specifically, at least one of a chip inductor, a chip capacitor, and a chip resistor may constitute the matching network 413 and may be coupled via the second electrode to the third electronic component. The first electronic component may include the power amplifier 11, and the third electronic component may include the switch 52. The matching network 413 may be coupled between the power amplifier 11 and the switch 52. Such a configuration can reduce the trace length between the power amplifier 11 and the switch 52, which are coupled via the matching network 413.

In Combination No. 10, for example, the first electronic component may be an electronic component including the low-noise amplifier 21; the second electronic component may be a chip inductor, a chip capacitor, a chip resistor, or any combination thereof that constitutes the matching network 433; and the third electronic component may be the electronic component including the switch 53. Specifically, at least one of a chip inductor, a chip capacitor, and a chip resistor may constitute the matching network 433 and may be coupled via the second electrode to the third electronic component. The first electronic component may include the low-noise amplifier 21, and the third electronic component may include the switch 53. The matching network 433 may be coupled between the low-noise amplifier 21 and the switch 53. Such a configuration can reduce the trace length between the low-noise amplifier 21 and the switch 53, which are coupled via the matching network 433.

In Combination No. 6 of Table 1 above, the chip inductor, chip capacitor, and chip resistor as the second electronic component may be coupled to the third electronic component instead of the external connection terminal 150. In this case, the third electronic component may include the power amplifier 12. Specifically, at least one of the chip inductor, chip capacitor, and chip resistor may constitute the matching network 442 and may be coupled via the second electrode to the third electronic component. The first electronic component may include the filter 64, and the third electronic component may include the power amplifier 12. The matching network 442 may be coupled between the filter 64 and the power amplifier 12. Such a configuration can reduce the trace length between the filter 64 and the power amplifier 12, which are coupled via the matching network 442.

In Examples and the modifications described above, the circuit element included in the first electronic component and the circuit element included in the third electronic component may be swapped with each other. For example, in Combination No. 1, the first electronic component may include the switch 51 while the third electronic component includes the filter 61.

In Combination Nos. 1 to 5 and 7 to 12 of Tables 1 and 2 above, the second electronic component may be coupled to any external connection terminal 150. In this case, the second electronic component may serve as a shunt inductor or a shunt capacitor.

The filters 61 to 65 are included in the respective electronic components in Examples above but are not limited thereto. For example, the filters 61 and 63 may be included in a single electronic component, and the filters 64 and 65 may be included in a single electronic component.

The plural external connection terminals 150 are copper post electrodes in the aforementioned Examples 1 to 4 but are not limited thereto. For example, the plural external connection terminals 150 may be bump electrodes. In this case, the radio-frequency module does not need to include the resin member 95.

Each of the electrodes 4113 and 4114 of the matching network 411 or any other component disposed between the major surfaces 91b and 92a (the middle layer) includes a side trace of the core material 4111 and is coupled to the major surfaces 91b and 92a in Examples above, but is not limited to such a configuration.

Figure 21:
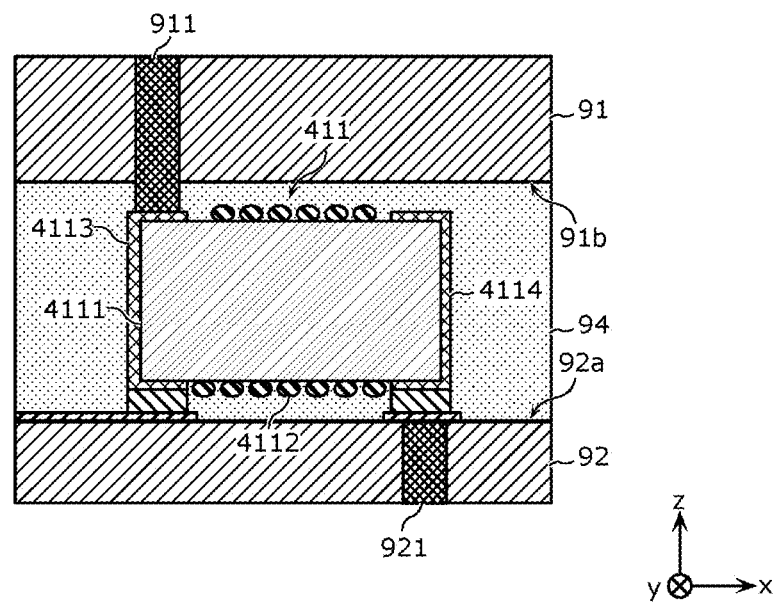
FIG. 21 is a partial cross-sectional view of a radio-frequency module according to a modification.

For example, at least one of the electrodes 4113 and 4114 may be coupled to either the major surface 91b or 92b, but not both. Specifically, as illustrated in FIG. 21, the electrode 4114 may be coupled to the major surface 92a and does not need to be coupled to the major surface 91b. The electrode 4113 may be coupled to the major surface 91b and does not need to be coupled to the major surface 92a (not illustrated).

Figure 22:
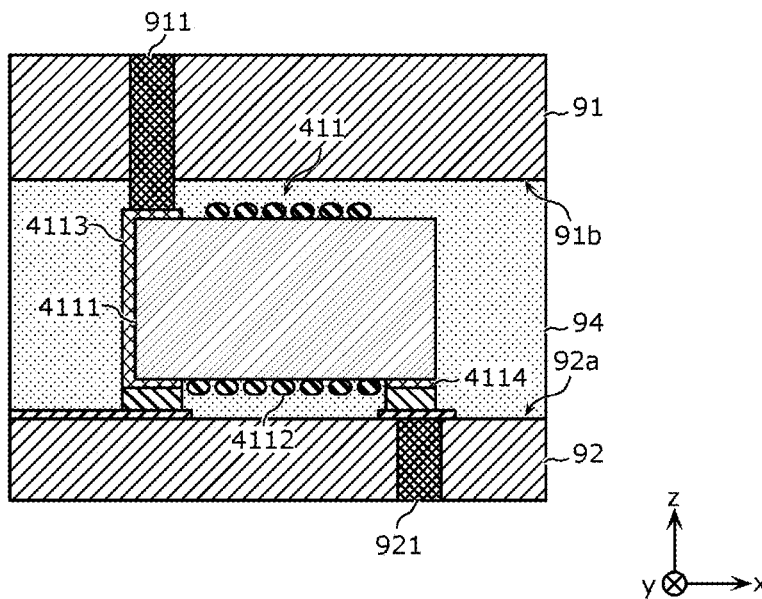
FIG. 22 is a partial cross-sectional view of a radio-frequency module according to another modification.

Furthermore, for example, at least one of the electrodes 4113 and 4114 does not need to include a side wiring. Specifically, as illustrated in FIG. 22, the electrode 4114 does not need to include any side wiring and does not need to be coupled to the major surface 91b. Alternatively, the electrode 4113 does not need to include any side wiring and does not need to be coupled to the major surface 92*a* (not illustrated).

INDUSTRIAL APPLICABILITY

The present disclosure can be widely used in communication devices, including mobile phones, as a radio-frequency module provided in the front end.

REFERENCE SIGNS LIST

1 RADIO-FREQUENCY CIRCUIT
1A, 1B, 1C, 1D RADIO-FREQUENCY MODULE
2 ANTENNA
3 RFIC
4 BBIC
5 COMMUNICATION DEVICE
11, 12 POWER AMPLIFIER
20, 50, 70 INTEGRATED CIRCUIT
21, 22 LOW-NOISE AMPLIFIER
51, 52, 53 SWITCH
61, 62, 63, 64, 65 FILTER
71 PA CONTROLLER
91, 92 MODULE SUBSTRATE
91*a*, 91*b*, 92*a*, 92*b* MAJOR SURFACE
93, 94, 95 RESIN MEMBER
96 SHIELD ELECTRODE LAYER
100 ANTENNA CONNECTION TERMINAL
111, 112 RADIO-FREQUENCY INPUT TERMINAL
121, 122 RADIO-FREQUENCY OUTPUT TERMINAL
131 CONTROL TERMINAL
150 EXTERNAL CONNECTION TERMINAL
151 INTER-SUBSTRATE CONNECTION TERMINAL
401, 411, 412, 413, 422, 431, 432, 433, 441, 442, 451, 452 MATCHING NETWORK
511, 512, 513, 514, 515, 516, 521, 522, 523, 524, 531, 532, 533 TERMINAL
911, 921, V1 VIA CONDUCTOR
1000 MOTHERBOARD
4111 CORE MATERIAL
4112 WINDING
4113, 4114 ELECTRODE

The invention claimed is:

1. A radio-frequency module, comprising:
a first module substrate including a first major surface and a second major surface that are opposite to each other;
a second module substrate including a third major surface and a fourth major surface that are opposite to each other, the third major surface being disposed facing the second major surface;
a plurality of electronic components disposed between the second major surface and the third major surface, on the first major surface, and on the fourth major surface; and
an external connection terminal disposed on the fourth major surface, wherein
the plurality of electronic components include
a first electronic component disposed on the first major surface,
a second electronic component that includes a first electrode joined to the second major surface and a second electrode joined to a third major surface and that is disposed between the second major surface and the third major surface, and
a third electronic component disposed on the fourth major surface, and the second electronic component is at least one of a chip inductor, a chip capacitor, and a chip resistor, and
the second electronic component is coupled via the first electrode to the first electronic component and is coupled via the second electrode to the third electronic component or the external connection terminal.

2. The radio-frequency module according to claim 1, wherein
at least a part of the second electronic component overlaps at least a part of the first electronic component in a planar view.

3. The radio-frequency module according to claim 1, wherein
in a planar view, at least a part of the second electronic component overlaps at least a part of the third electronic component or the external connection terminal that is coupled via the second electrode to the second electronic component.

4. The radio-frequency module according to claim 1, wherein
at least one of the chip inductor, the chip capacitor, and the chip resistor constitutes an impedance matching network and is coupled via the second electrode to the third electronic component,
the first electronic component includes a filter,
the third electronic component includes a switch, and
the impedance matching network is coupled between the filter and the switch.

5. The radio-frequency module according to claim 4, wherein
the switch is coupled between the impedance matching network and an antenna connection terminal.

6. The radio-frequency module according to claim 4, wherein
the switch is coupled between the impedance matching network and a power amplifier.

7. The radio-frequency module according to claim 4, wherein
the switch is coupled between the impedance matching network and a low-noise amplifier.

8. The radio-frequency module according to claim 1, wherein
at least one of the chip inductor, the chip capacitor, and the chip resistor constitutes an impedance matching network and is coupled via the second electrode to the third electronic component,
the first electronic component includes a filter,
the third electronic component includes a low-noise amplifier, and
the impedance matching network is coupled between the filter and the low-noise amplifier.

9. The radio-frequency module according to claim 1, wherein
at least one of the chip inductor, the chip capacitor, and the chip resistor constitutes an impedance matching network and is coupled via the second electrode to the third electronic component,
the first electronic component includes a filter,
the third electronic component includes a power amplifier, and
the impedance matching network is coupled between the filter and the power amplifier.

10. The radio-frequency module according to claim 1, wherein
at least one of the chip inductor, the chip capacitor, and the chip resistor constitutes an impedance matching network and is coupled via the second electrode to the external connection terminal used as an antenna connection terminal, the first electronic component includes a switch, and the impedance matching network is coupled between the switch and the antenna connection terminal.

11. The radio-frequency module according to claim 1, wherein at least one of the chip inductor, the chip capacitor, and the chip resistor constitutes an impedance matching network and is coupled via the second electrode to the third electronic component, the first electronic component includes a power amplifier, the third electronic component includes a switch, and the impedance matching network is coupled between the power amplifier and the switch.

12. The radio-frequency module according to claim 1, wherein at least one of the chip inductor, the chip capacitor, and the chip resistor constitutes an impedance matching network and is coupled via the second electrode to the third electronic component, the first electronic component includes a low-noise amplifier, the third electronic component includes a switch, and the impedance matching network is coupled between the low-noise amplifier and the switch.

13. A communication device, comprising:

a signal processing circuit processing a radio-frequency signal, and the radio-frequency module according to claim 1 that transfers the radio-frequency signal between the signal processing circuit and an antenna.

* * * * *